United States Patent
Kim et al.

(10) Patent No.: US 10,872,927 B2
(45) Date of Patent: Dec. 22, 2020

(54) IMAGE SENSORS HAVING SEPARATION STRUCTURES

(71) Applicant: Samsung Electronics Co., Ltd., Suwon-si (KR)

(72) Inventors: Changhwa Kim, Hwaseong-si (KR); Sejung Park, Hwaseong-si (KR); Junghun Kim, Suwon-si (KR); Sangsu Park, Seoul (KR); Kyungrae Byun, Suwon-si (KR); Beom Suk Lee, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/851,763

(22) Filed: Dec. 22, 2017

(65) Prior Publication Data

US 2019/0027539 A1 Jan. 24, 2019

(30) Foreign Application Priority Data

Jul. 21, 2017 (KR) .................. 10-2017-0092476

(51) Int. Cl.
*H01L 51/44* (2006.01)
*H01L 27/30* (2006.01)

(52) U.S. Cl.
CPC .......... *H01L 27/307* (2013.01); *H01L 51/441* (2013.01); *H01L 51/447* (2013.01)

(58) Field of Classification Search
CPC ................................................... H01L 51/441
See application file for complete search history.

(56) References Cited

U.S. PATENT DOCUMENTS

| | | | |
|---|---|---|---|
| 6,924,228 B2 | 8/2005 | Kim et al. | |
| 7,288,429 B2 | 10/2007 | Yaung et al. | |
| 8,704,281 B2 | 4/2014 | Maehara et al. | |
| 9,130,180 B2 | 9/2015 | Park | |
| 9,293,489 B2 | 3/2016 | Lee et al. | |
| 9,426,399 B2 | 8/2016 | Yamaguchi | |
| 2007/0051874 A1 | 3/2007 | Takeda et al. | |
| 2008/0158137 A1* | 7/2008 | Yoshida | G09G 3/3413 345/102 |
| 2009/0166788 A1 | 7/2009 | Lim | |

(Continued)

FOREIGN PATENT DOCUMENTS

| | | |
|---|---|---|
| JP | 2007234651 A | 9/2007 |
| KR | 10-2017-0071183 A | 6/2017 |

OTHER PUBLICATIONS

Search Report and Written Opinion, Singapore Patent Office, corresponding to Singapore Patent Application No. 10201805041X, dated Aug. 27, 2018, 9 pages.

*Primary Examiner* — Thao X Le
*Assistant Examiner* — Geoffrey H Ida
(74) *Attorney, Agent, or Firm* — Myers Bigel, P.A.

(57) ABSTRACT

An image sensor includes an insulating pattern disposed on a semiconductor substrate and having an opening, a color filter disposed within the opening of the insulating pattern, a capping insulating layer disposed on the color filter, a first electrode disposed on the capping insulating layer and having a portion overlapping with the color filter, a separation structure surrounding a side surface of the first electrode, and a photoelectric layer disposed on the first electrode. The separation structure includes a first insulating layer and a second insulating layer formed of different material.

19 Claims, 45 Drawing Sheets

(56) References Cited

U.S. PATENT DOCUMENTS

2012/0267745 A1  10/2012  Tsuji
2015/0372033 A1  12/2015  Cheng et al.
2015/0372036 A1  12/2015  Suh et al.
2016/0020257 A1   1/2016  Lee et al.
2016/0307940 A1  10/2016  Cheng et al.
2017/0170238 A1   6/2017  Lee et al.

* cited by examiner

IMAGE SENSORS HAVING SEPARATION STRUCTURES

CROSS-REFERENCE TO RELATED APPLICATION

This application claims benefit of priority to Korean Patent Application No. 10-2017-0092476, filed on Jul. 21, 2017 in the Korean Intellectual Property Office, the disclosure of which is incorporated herein by reference in its entirety.

BACKGROUND

1. Technical Field

The present inventive concept relates to an image sensor, and more particularly, to an image sensor including an electrode and a method of forming the same.

2. Description of Related Art

Image sensors capturing images and converting images into electrical signals have been used in cameras mounted in automobiles, security devices, and robots, as well as consumer electronics, such as digital cameras, cameras for mobile phones, and portable camcorders. These image sensors have required compact size and high resolution.

SUMMARY

According to an aspect of the present inventive concept, an image sensor is provided. The image sensor includes an insulating pattern disposed on a semiconductor substrate and having an opening, a color filter disposed in the opening of the insulating pattern, a capping insulating layer disposed on the color filter, a first electrode disposed on the capping insulating layer and having a portion thereof overlapping the color filter, a separation structure surrounding a side surface of the first electrode, and a photoelectric layer disposed on the first electrode. The separation structure may include a first insulating layer and a second insulating layer formed of different materials.

According to an aspect of the present inventive concept, an image sensor is provided. The image sensor includes an insulating pattern disposed on a semiconductor substrate and having an opening, a color filter disposed in the opening of the insulating pattern, a capping insulating layer disposed on the color filter, an electrode disposed on the capping insulating layer, a separation structure surrounding a side surface of the electrode, and a photoelectric layer disposed on the electrode and the separation structure. The separation structure has an upper surface recessed in a direction toward the semiconductor substrate.

According to an aspect of the present inventive concept, an image sensor is provided. The image sensor includes an insulating pattern disposed on a semiconductor substrate and having a first opening, a color filter disposed in the first opening of the insulating pattern, a contact plug passing through the insulating pattern, a capping insulating layer disposed on the color filter, a separation structure having a second opening overlapping the capping insulating layer and the contact plug, a first electrode disposed in the second opening of the separation structure, and a photoelectric layer disposed on the first electrode. The separation structure includes a first insulating layer and a second insulating layer formed of different materials.

According to an aspect of the present inventive concept, an image sensor is provided. The image sensor includes a through electrode disposed in a through hole passing through a semiconductor substrate, an insulating pattern disposed on the semiconductor substrate and having a first opening, a color filter disposed in the first opening of the insulating pattern, a capping insulating layer disposed on the color filter, a separation structure having a second opening overlapping the capping insulating layer, and an electrode disposed in the second opening of the separation structure. The separation structure has an upper surface recessed in a direction toward the semiconductor substrate.

BRIEF DESCRIPTION OF DRAWINGS

The above, and other aspects, features, and advantages of the present disclosure will be more clearly understood from the following detailed description when taken in conjunction with the accompanying drawings, in which.

DETAILED DESCRIPTION

Figure 1:
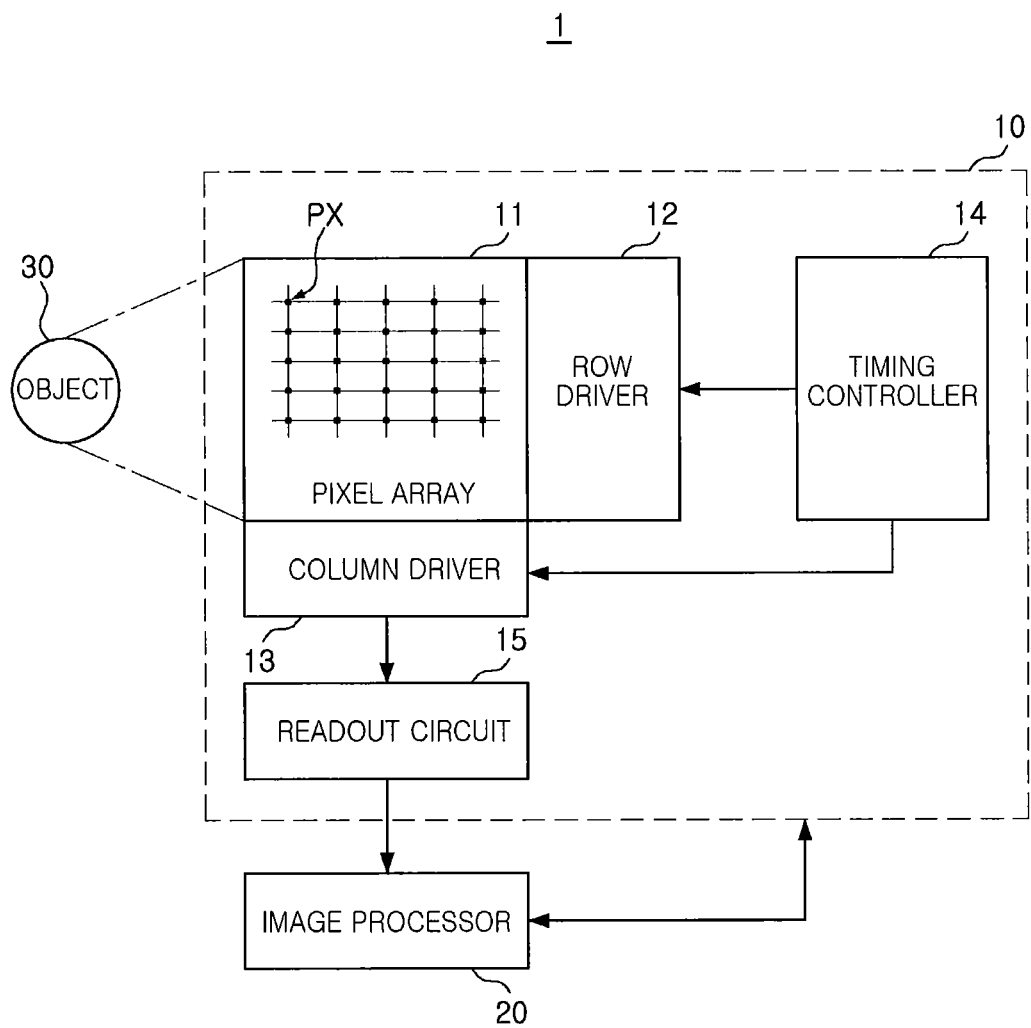
FIG. 1 is a block diagram of an image processing apparatus including an image sensor according to an example embodiment.

An image sensor, according to an example embodiment, will be described with reference to FIG. 1. FIG. 1 is a block diagram of an image processing apparatus 1 including an image sensor 10, according to an example embodiment.

Referring to FIG. 1, the image processing apparatus 1 may include the image sensor 10 and an image processor 20.

The image sensor 10 may include a pixel array 11, a row driver 12, a column driver 13, a timing controller 14, and a readout circuit 15.

The image sensor 10 may operate in response to a control command received from the image processor 20, and may convert light reflected from an external object 30 into an electrical signal and output the electrical signal to the image processor 20. The pixel array 11 included in the image sensor 10 may include a plurality of pixels PX. The pixels PX may include photoelectric elements receiving light to generate electric charges.

The row driver 12 may drive the pixel array 11 in units of rows. For example, the row driver 12 may generate a transfer control signal controlling a transfer transistor of each of the pixels PX, a reset control signal controlling a reset transistor of each of the pixels PX, and a select control signal controlling a select transistor of each of the pixels PX.

The column driver 13 may include a correlated double sampler (CDSi) and an analog-to-digital converter (ADC). The correlated double sampler (CDS) may perform correlated double sampling by receiving an electrical signal through column lines connected to the pixels PX included in a row selected by a row select signal supplied by the row driver 12. The analog-to-digital converter (ADC) may convert an output from the correlated double sampler (CDS) into a digital signal, and may transmit the digital signal to the readout circuit 15.

The readout circuit 15 may include a latch or buffer circuit temporarily storing a digital signal and an amplification circuit. The readout circuit 15 may temporarily store or amplify a digital signal received from the column driver 13 to generate image data.

Operation timings of the row driver 12, the column driver 13, and the readout circuit 15 may be determined by the timing controller 14, and the timing controller 14 may operate in response to a control command transmitted by the image processor 20. The image processor 20 may perform signal processing on image data transmitted by the readout circuit 15, and may output the signal-processed image data to a display device or the like or store the signal-processed image data in a storage device such as a memory.

Figure 2A:
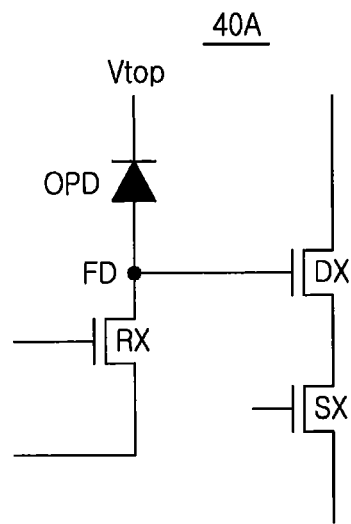
FIGS. 2A and 2B are circuit diagrams illustrating pixel circuits included in an image sensor according to an example embodiment.
Figure 2B:
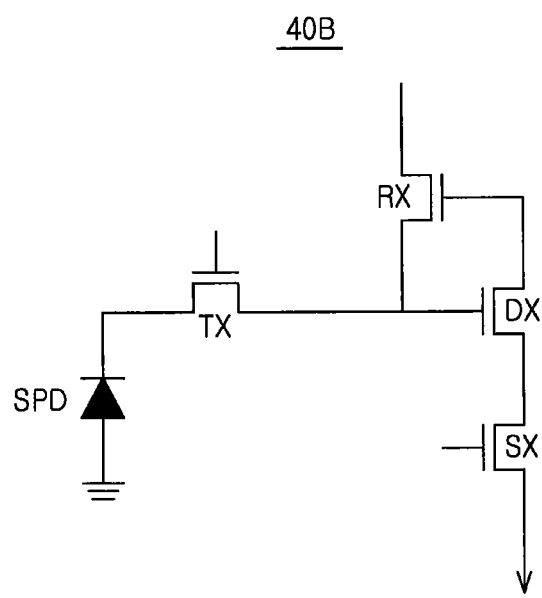

In an example embodiment, each of the pixels PX may include two or more photoelectric elements, and two or more photoelectric elements included in one of the pixels PX may receive light of different colors to generate electric charges. When the one pixel PX includes two or more photoelectric elements, each pixel PX may include a pixel circuit to process electric charges generated by the two or more photoelectric elements, respectively. The pixel circuit connected to each of the two or more photoelectric elements described above will be described with reference to FIGS. 2A and 2B. FIGS. 2A and 2B are circuit diagrams illustrating pixel circuits included in an image sensor, according to an example embodiment.

Each of the pixels PX may include a first photoelectric element OPD of FIG. 2A and a second photoelectric element SPD of FIG. 2B.

First, a first pixel circuit 40A of FIG. 2A, connected to the first photoelectric element OPD of FIG. 2A, will be described with reference to FIG. 2A.

Referring to FIGS. 1 and 2A, the first pixel circuit 40A connected to the first photoelectric element OPD may include a reset transistor RX, a drive transistor DX, and a select transistor SX.

A gate terminal of the drive transistor DX may be connected to a floating diffusion FD, and electric charges generated by the first photoelectric element OPD may be accumulated in the floating diffusion FD.

In an example embodiment, the first photoelectric element OPD may include first and second electrodes disposed parallel to each other, and a photoelectric layer provided therebetween. The first and second electrodes may be transparent electrodes. The photoelectric layer may be an organic photoelectric layer receiving light in a predetermined wavelength band to generate electric charges.

The drive transistor DX may operate as a source follower buffer amplifier by electric charges accumulated in the floating diffusion FD. The drive transistor DX may amplify the electrical charges accumulated in the floating diffusion FD and transfer the amplified electrical charges to the select transistor SX.

The select transistor SX may operate in response to a select control signal input by the row driver of 12 FIG. 1, and may perform switching and addressing operations. When a select control signal from the row driver 12 of FIG. 1 is applied to the select transistor SX, a pixel signal may be output to a column line connected to the select transistor SX. The output pixel signal described above may be detected by the column driver 13 of FIG. 1 and the readout circuit 15 of FIG. 1.

The reset transistor RX may operate in response to a reset control signal input by the row driver 12 of FIG. 1. The reset control signal may cause the reset transistor RX to reset a voltage of the floating diffusion FD to a readout voltage.

The first photoelectric element OPD may be an organic photoelectric conversion element or an organic photodiode. The first photoelectric element OPD may use holes as principal charge carriers. When the holes are used as the principal charge carriers, a cathode of the first photoelectric element OPD may be connected to the floating diffusion FD, and an anode of the first photoelectric element OPD may be connected to an upper electrode voltage Vtop.

In an example embodiment, the upper electrode voltage Vtop may have a voltage of several volts, for example, about 3.0 V. Because holes are generated as principal charge carriers by the first photoelectric element OPD, a drain terminal of the reset transistor RX may be connected to a readout voltage having a voltage level different from that of a power supply voltage. The first pixel circuit 40A may be implemented to use the holes as the principal charge carriers to improve dark current characteristics.

A second pixel circuit 40B of FIG. 2 connected to the second photoelectric element SPD of FIG. 2 will be described with reference to FIG. 2B.

Referring to FIGS. 1 and 2B, the second pixel circuit 40B connected to the second photoelectric element SPD may include a reset transistor RX, a drive transistor DX, a select transistor SX, and a transfer transistor TX.

The second photoelectric element SPD may be a silicon photodiode or a silicon photoelectric conversion element formed within a semiconductor substrate including silicon or the like, and may be connected to a floating diffusion FD through the transfer transistor TX. A cathode or anode of the second photoelectric element SPD may not be directly connected to the floating diffusion FD.

The transfer transistor TX may transfer electric charges accumulated in the second photoelectric element SPD to the floating diffusion FD, based on a transfer control signal transmitted by the row driver 12 of FIG. 1.

The second photoelectric element SPD may generate electrons as principal charge carriers.

Operations of the reset transistor RX, the drive transistor DX, and the select transistor SX may be similar to those described above with reference to FIG. 2A, and a pixel signal may be output through a column line connected to the select transistor SX. The output pixel signal may be detected by the column driver 13 of FIG. 1 and the readout circuit 15 of FIG. 1.

Figure 3:
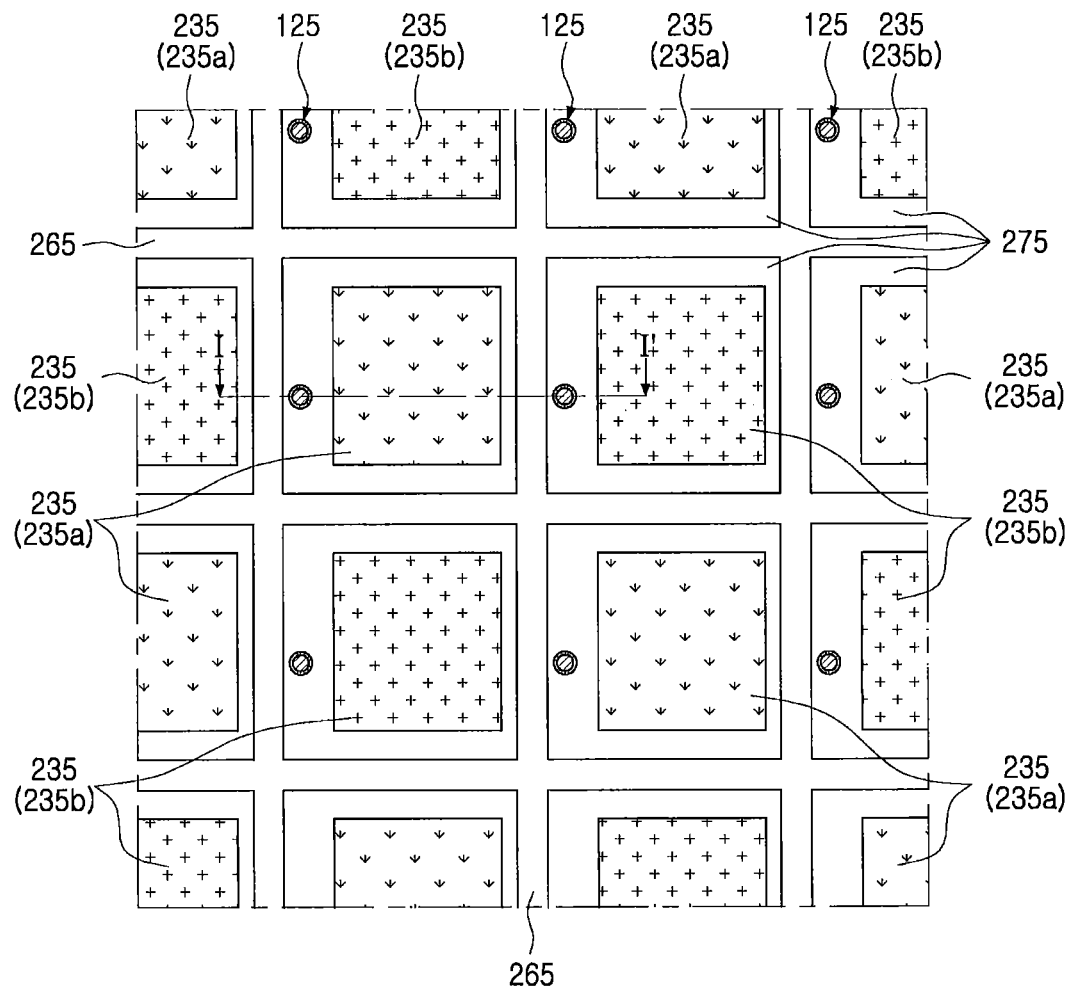
FIG. 3 is a plan view illustrating a semiconductor device according to an example embodiment.
Figure 4:
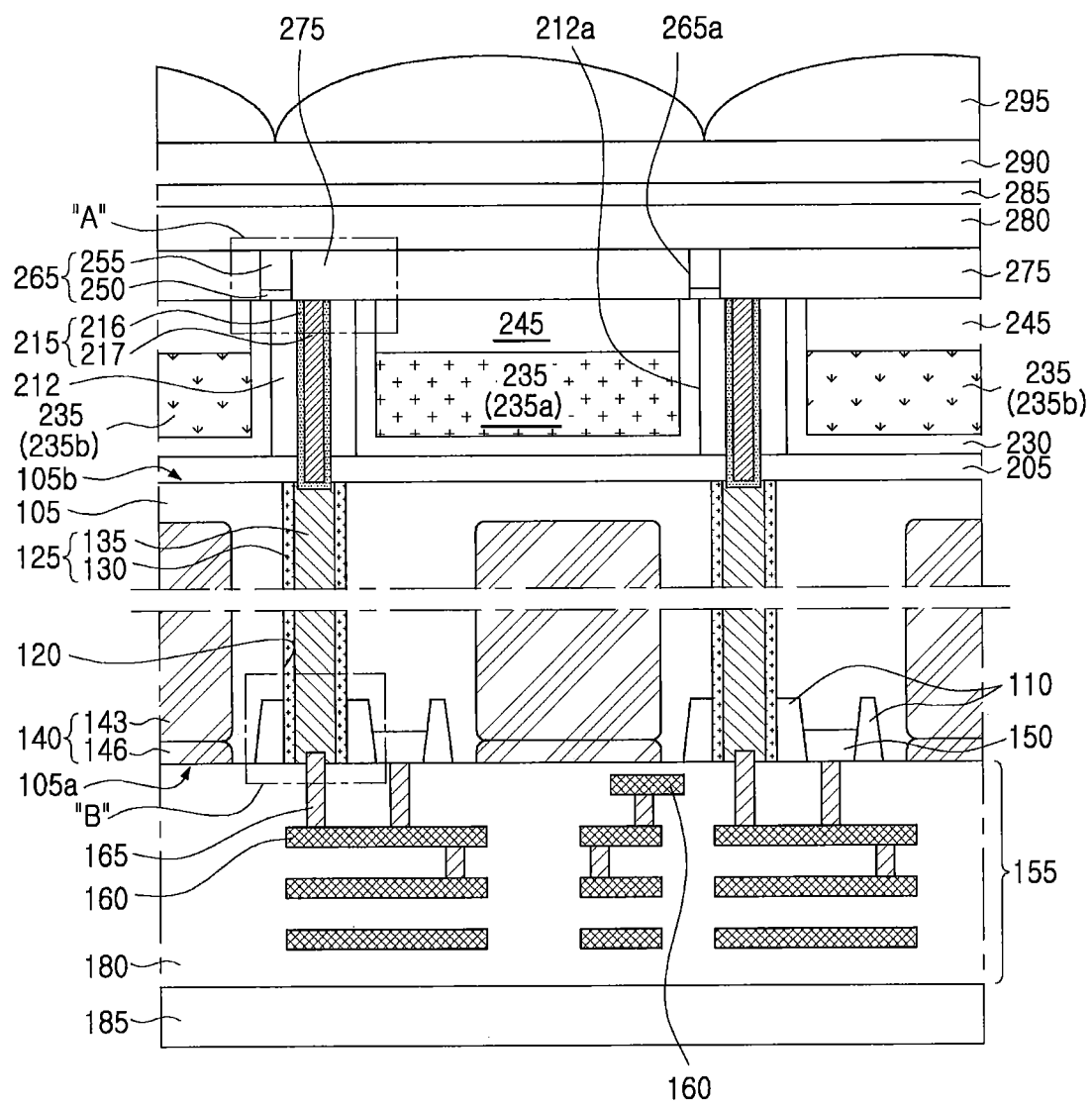
FIG. 4 is a cross-sectional view illustrating an image sensor according to an example embodiment.
Figure 5A:
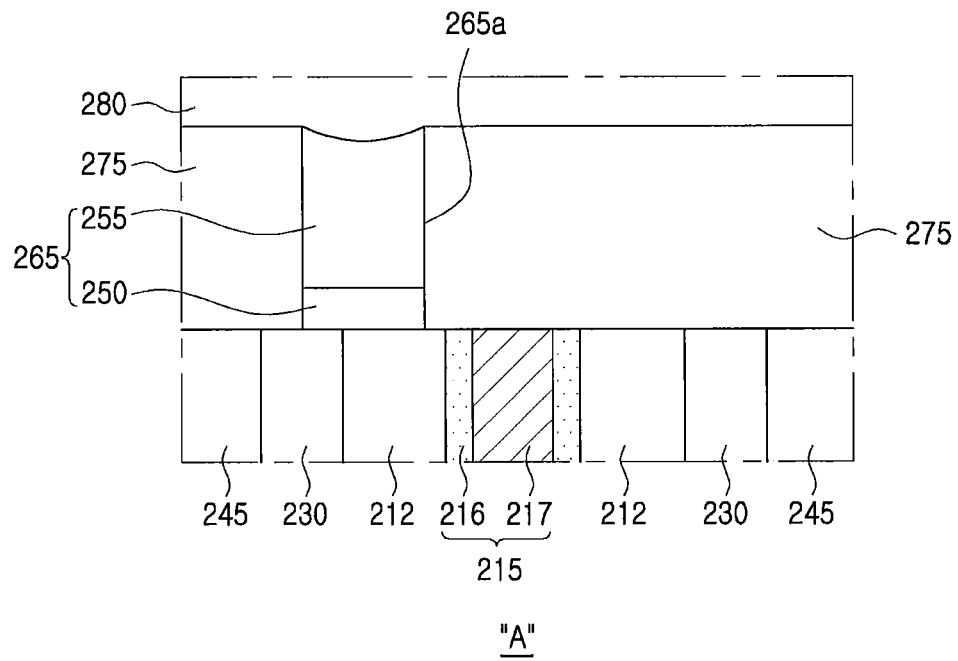
FIG. 5A is an enlarged view of region A of FIG. 4 according to an example embodiment.

An example of an image sensor including the first and second photoelectric elements OPD and SPD will be described with reference to FIGS. 3, 4, and 5A. FIG. 3 is a plan view illustrating an image sensor, according to an example embodiment. FIG. 4 is a cross-sectional view taken along line I-I' of FIG. 3, illustrating an example of an image sensor, according to an example embodiment. FIG. 5A is an enlarged view of region A of FIG. 4, illustrating an example of an image sensor, according to an example embodiment.

Referring to FIGS. 3, 4, and 5A, photodiodes 140 may be disposed within a semiconductor substrate 105 having a first surface 105a and a second surface 105b opposing each other. The photodiodes 140 may convert light received to the photodiodes 140 into an electrical signal. The photodiodes 140 may be the second photoelectric element SPD described above with reference to FIG. 2B. The photodiodes 140 may also be referred to using the terms "silicon photoelectric conversion element," or "semiconductor photoelectric conversion element."

Each of the photodiodes 140 may include a first impurity region 143 and a second impurity region 146 having different conductivity types. The first impurity region 143 may be formed to be deeper than the second impurity region 146 from the first surface 105a of the semiconductor substrate 105. The first impurity region 143 and the second impurity region 146 may have different conductivity types. For example, one of the first impurity region 143 and the second impurity region 146 may have n-type conductivity, and the other thereof may have p-type conductivity. For example, the second impurity region 146 may have p-type conductivity, and the first impurity region 143 may have n-type conductivity in at least a region thereof adjacent to the second impurity region 146. A p-n junction between the first and second impurity regions 143 and 146 may be closer to the first surface 105a than the second surface 105b of the semiconductor substrate 105.

By an isolation region 110 within the semiconductor substrate 105, storage node regions 150 may be disposed, and the storage node regions 150 may be spaced apart from the photodiodes 140. The storage node regions 150 may have a different conductivity type from that of the semiconductor substrate 105. For example, the semiconductor substrate 105 may have p-type conductivity, and the storage node regions 150 may have n-type conductivity. In an example embodiment, the storage node regions 150 may be the floating diffusion FD of FIG. 2A described above with reference to FIG. 2A.

A circuit interconnection region 155 may be disposed on the first surface 105a of the semiconductor substrate 105. The circuit interconnection region 155 may include a front insulating structure 180 disposed on the first surface 105a of the semiconductor substrate 105, and wiring layers 160 and front vias 165 disposed in the front insulating structure 180.

A support layer 185 may be disposed on the circuit interconnection region 155. The support layer 185 may be used to provide rigidity to the semiconductor substrate 105. The support layer 185 may be formed of a silicon oxide, a silicon nitride, and/or a semiconductor material.

Through holes 120 may be formed through the semiconductor substrate 105. The through holes 120 may pass through between the first surface 105a and the second surface 105b of the semiconductor substrate 105.

In an example embodiment, the through holes 120 may pass through the isolation region 110 adjacent to the first surface 105a of the semiconductor substrate 105.

Through electrode structures 125 may be disposed in the through holes 120.

Each of the through electrode structures 125 may include a through electrode 135, and an insulating spacer 130 surrounding a side surface of the through electrode 135.

The through electrode 135 may pass through the semiconductor substrate 105, and the insulating spacer 130 may be interposed between the semiconductor substrate 105 and the through electrode 135. The through electrode 135 may be formed of a conductive material, for example, polysilicon. The insulating spacer 130 may be formed of an insulating material, such as a silicon oxide and/or a silicon nitride.

An antireflective layer 205 may be disposed on the second surface 105b of the semiconductor substrate 105.

The antireflective layer 205 may prevent the reflection of light received from outside the semiconductor substrate 105 toward the second surface 105b of the semiconductor substrate 105 to redirect the light to the photodiodes 140. The antireflective layer 205 may be formed of, for example, SiON, SiC, SiCN, or SiCO.

The antireflective layer 205 may have an insulating pattern 212 disposed thereon, and the insulating pattern 212 may have first openings 212a. The insulating pattern 212 may be formed of an insulating material, such as a silicon oxide.

The antireflective layer 205 may have color filters 235 disposed thereon, and the color filters 235 may be spaced apart from one another. The antireflective layer 205 may be disposed between the second surface 105b of the semiconductor substrate 105 and the insulating pattern 212 and between the second surface 105b of the semiconductor substrate 105 and the color filters 235.

The color filters 235 may correspond to the first openings 212a of the insulating pattern 212 on a one-to-one basis, and may be disposed in the first openings 212a of the insulating pattern 212. The color filters 235 may overlap the photodiodes 140. The color filters 235 may include first color filters 235a and second color filters 235b adjacent to each other in row and column directions.

In an example embodiment, the first color filters 235a may be red filters, and the second color filters 235b may be blue filters. For example, the first color filters 235a may be red filters allowing light having a red wavelength to pass therethrough to reach the photodiodes 140 overlapping the first color filters 235a, and the second color filters 235b may be blue filters allowing light having a blue wavelength to pass therethrough to reach the photodiodes 140 overlapping the second color filters 235b.

The color filters 235 may have capping insulating layers 245 disposed thereon. In an example embodiment, the color filters 235 and the capping insulating layers 245 may be stacked sequentially. The color filters 235 and the capping insulating layers 245 may be disposed in the first openings 212a of the insulating pattern 212. Thus, each of the sequentially stacked color filters 235 and capping insulating layers 245 may be surrounded by the insulating pattern 212. The capping insulating layers 245 may be self-aligned with the color filters 235. The capping insulating layers 245 may be formed of an insulating material, such as a silicon oxide. Each of the capping insulating layers 245 may have an upper surface coplanar with an upper surface of the insulating pattern 212.

Insulating liners 230 may be disposed to be interposed between bottom surfaces of the color filters 235 and the antireflective layer 205 and to extend between side surfaces of the color filters 235 and the insulating pattern 212. The insulating liners 230 may extend between the insulating pattern 212 and side surfaces of the capping insulating layers 245, while covering the side surfaces of the color filters 235. The insulating liners 230 may have upper surfaces coplanar with the upper surfaces of the capping insulating layers 245. The insulating liners 230 may be formed of an insulating material, such as a silicon oxide.

Contact plugs 215 may be formed to continuously pass through the insulating pattern 212 and the antireflective layer 205 and to be electrically connected to the through electrodes 135 of the through electrode structures 125. The contact plugs 215 may be formed integrally according to an embodiment.

Each of the contact plugs 215 may include a plug portion 217 and a barrier layer 216 covering a side surface and a bottom surface of the plug portion 217. In each contact plug 215, the plug portion 217 may continuously pass through the insulating pattern 212 and the antireflective layer 205, and may be formed of a metal, such as tungsten. The barrier layer 216 may be formed of a conductive material including a metal nitride, such as a titanium nitride.

In an example embodiment, the contact plugs 215, the insulating pattern 212, the insulating liners 230, and the capping insulating layers 245 may have upper surfaces coplanar with one another.

A separation structure 265 may be disposed on the insulating pattern 212. The separation structure 265 may have second openings 265a. The second openings 265a may expose the contact plugs 215 and the capping insulating layers 245.

In the separation structure 265, each of the second openings 265a may overlap a single color filter and a single contact plug. For example, each of the second openings 265a may expose a single capping insulating layer on a single color filter, and may expose a single contact plug.

The separation structure 265 may be formed of materials having etch selectivity with respect to each other, and may include first and second insulating layers 250 and 255 aligned in a vertical direction. One of the first and second insulating layers 250 and 255 may be formed of a material having etch selectivity with respect to the capping insulating layers 245. The second insulating layer 255 may be disposed on the first insulating layer 250. The first insulating layer 250 may be formed of a material having etch selectivity with respect to the capping insulating layers 245. The second insulating layer 255 may be thicker than the first insulating layer 250. The first insulating layer 250 may be formed of a material having etch selectivity with respect to the second insulating layer 255 and the capping insulating layers 245. The first insulating layer 250 may be formed of a material having etch selectivity with respect to the second insulating layer 255, the capping insulating layers 245, and the insulating liners 230. For example, the second insulating layer 255, the capping insulating layers 245, and the insulating liners 230 may be formed of oxide-based insulating materials, for example, a silicon oxide, and the first insulating layer 250 may be formed of a nitride-based insulating material, for example, a silicon nitride.

The first electrodes 275 may be disposed in the second openings 265a of the separation structure 265. The separation structure 265 may surround side surfaces of the first electrodes 275, as illustrated in FIG. 3. Each of the first electrodes 275 may have an upper surface coplanar with the upper surface of the separation structure 265.

In an example embodiment, the separation structure 265 may have an upper surface having a downwardly concave shape, as illustrated in FIG. 5A. The separation structure 265 may have an upper surface recessed in a direction toward the semiconductor substrate 105, rather than the upper surface of each of the first electrodes 275. The separation structure 265 may have an upper surface continuously extending from the upper surfaces of the first electrodes 275 without a stepped portion and forming a curved surface. The curved surface formed by the upper surface of the separation structure 265 may be bent in a direction toward the semiconductor substrate 105. The upper surface of the separation structure 265 may have a central portion that is concave in the direction toward the semiconductor substrate 105. For example, the separation structure 265 may have an upper surface formed as a surface curved in a downward direction from the edges of the first electrodes 275, while continuously extending from the upper surfaces of the first electrodes 275 without a stepped portion. Here, the term "downward direction" may refer to a direction toward the semiconductor substrate 105, based on the separation structure 265.

The first electrodes 275 may fill the second openings 265a of the separation structure 265, and may overlap the capping insulating layers 245, the color filters 235, and the contact plugs 215.

The first electrodes 275 may correspond to the color filters 235 on a one-to-one basis, and may overlap the color filters 235. For example, one of the first electrodes 275 may overlap one of the color filters 235.

The first electrodes 275 may correspond to the contact plugs 215 on a one-to-one basis. The first electrodes 275 may be electrically connected to the contact plugs 215 while being in contact with the contact plugs 215. Thus, one of the first electrodes 275 may overlap one of the color filters 235, and may be electrically connected to one of the contact plugs 215.

The first electrodes 275 may be transparent electrodes. For example, the first electrodes 275 may be formed of a transparent conductive material, such as ITO, IZO, ZnO, $SnO_2$, an antimony-doped tin oxide (ATO), an aluminium-doped zinc oxide (AZO), a gallium-doped zinc oxide (GZO), $TiO_2$, or a fluorine-doped tin oxide (FTO).

A photoelectric layer 280 may be disposed on the first electrodes 275 and the separation structure 265. The photoelectric layer 280 may cover the first electrodes 275 and the separation structure 265, and may be formed integrally.

The photoelectric layer 280 may be in contact with the first electrodes 275 and the upper surface of the separation structure 265.

In an example embodiment, the photoelectric layer 280 may be an organic photoelectric layer. For example, the photoelectric layer 280 may be an organic photoelectric layer formed of an organic material causing photoelectric conversion only of a particular light wavelength. For example, the photoelectric layer 280 may be an organic photoelectric layer causing photoelectric conversion of a green light wavelength.

The photoelectric layer 280 may be a layer in which a p-type semiconductor material and an n-type semiconductor material may form a p-n junction or a bulk heterojunction, may include a single layer or a plurality of layers, and may also be a layer receiving incident light, generating excitons, and then dividing the generated excitons into holes and electrons. The photoelectric layer 280 may be an organic photodiode. Each of the p-type semiconductor material and the n-type semiconductor material included in the photoelectric layer 280 may absorb light in a green wavelength range, and may exhibit a significantly increased absorption peak in a wavelength range from about 500 nm to about 600 nm.

Each of the p-type semiconductor material and the n-type semiconductor material of the photoelectric layer 280 may have, for example, a band gap of about 1.5 eV to about 3.5 eV, and may also have a band gap of about 2.0 eV to about 2.5 eV within the band gap range. Since having the band gap range, each of the p-type semiconductor material and the n-type semiconductor material of the photoelectric layer 280 may absorb light in a green wavelength range, and specifically, may exhibit a significantly increased absorption peak in a wavelength range from about 500 nm to about 600 nm.

The photoelectric layer 280 may include a single layer or a plurality of layers. The photoelectric layer 280 may include any combination of, for example, an intrinsic (I) layer, a p-type layer/I layer, an I layer/n-type layer, a p-type layer/I layer/n-type layer, and a p-type layer/n-type layer. The I layer may include the p-type semiconductor material and the n-type semiconductor material mixed at a ratio of about 1:100 to about 100:1. Within the mixture ratio range, the I layer may include the p-type semiconductor material and the n-type semiconductor material mixed at a ratio of about 1:50 to about 50:1, about 1:10 to about 10:1, or about 1:1. In the photoelectric layer 280, the p-type semiconductor material and the n-type semiconductor material may have a composition ratio, in the mixture ratio range, advantageous in effectively generating excitons and a p-n junction. The p-type layer may include the p-type semiconductor material, and the n-type layer may include the n-type semiconductor material. The photoelectric layer 280 may have a thickness of, for example, about 1 nm to about 500 nm. The photoelectric layer 280 may have a thickness at which the photoelectric layer 280 may effectively increase photoelectric conversion efficiency by effectively absorbing light and effectively dividing and transferring holes and electrons.

The photoelectric layer 280 may have a second electrode 285 disposed thereon. The second electrode 285 may be a transparent electrode. For example, the second electrode electrode 285 may be formed of a transparent conductive material, such as ITO, IZO, ZnO, $SnO_2$, ATO, AZO, GZO, $TiO_2$, or FTO. Thus, the first and second electrodes 275 and 285 may be transparent electrodes.

The first and second electrodes 275 and 285 and the photoelectric layer 280 therebetween may form the first photoelectric element OPD of FIG. 2A described above with reference to FIG. 2A. Thus, the first and second electrodes 275 and 285 and the photoelectric layer 280 therebetween may form an organic photoelectric element or an organic photoelectric conversion element.

The second electrode 285 may have a cover insulating layer 290 disposed thereon. The cover insulating layer 290 may be formed of an insulating material, such as a silicon oxide or a silicon nitride.

The cover insulating layer 290 may have microlenses 295 disposed thereon. The microlenses 295 may overlap the color filters 235. The microlenses 295 may redirect a path of light received to a region, except for the photodiodes 140, to concentrate the light on the photodiodes 140.

Figure 5B:
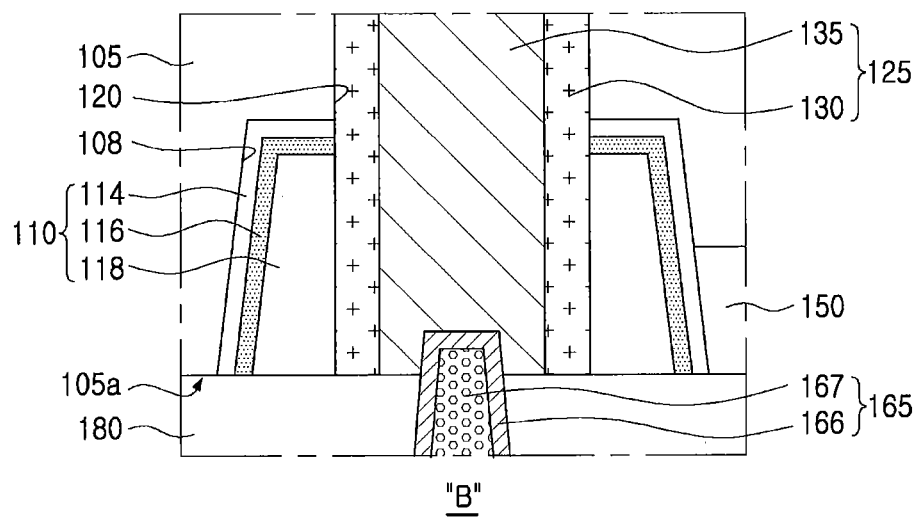
FIG. 5B is an enlarged view of region B of FIG. 4 according to an example embodiment.

In an example embodiment, the through holes 120 may pass through the isolation region 110. An example of the isolation region 110 and the through electrode structures 125 disposed in the through holes 120 will be described with reference to FIG. 5B. FIG. 5B is an enlarged view of region B of FIG. 4, illustrating an example of an image sensor, according to an example embodiment. Here, one of the through holes 120 and one of the through electrode structures 125 will be mainly described.

Referring to FIG. 5B, the isolation region 110 may be disposed in a trench 108 formed from the first surface 105a of the semiconductor substrate 105. The isolation region 110 may include a buffer oxide layer 114 conformally covering an inner wall of the trench 108, a liner layer 116 disposed on the buffer oxide layer, and an element separation layer 118 disposed on the liner layer 116 to fill the trench 108.

Each of the through electrode structures 125 may pass through the semiconductor substrate 105 and the isolation region 110.

One of the front vias 165 included in the circuit interconnection region 155 may be in contact with the through electrode 135 of the through electrode structure 125. One of the front vias 165 included in the circuit interconnection region 155 and a second conductive layer 167. The first conductive layer 166 may be interposed between the second conductive layer 167 and the through electrode 135, and may cover a side surface of the second conductive layer 167.

Figure 5C:
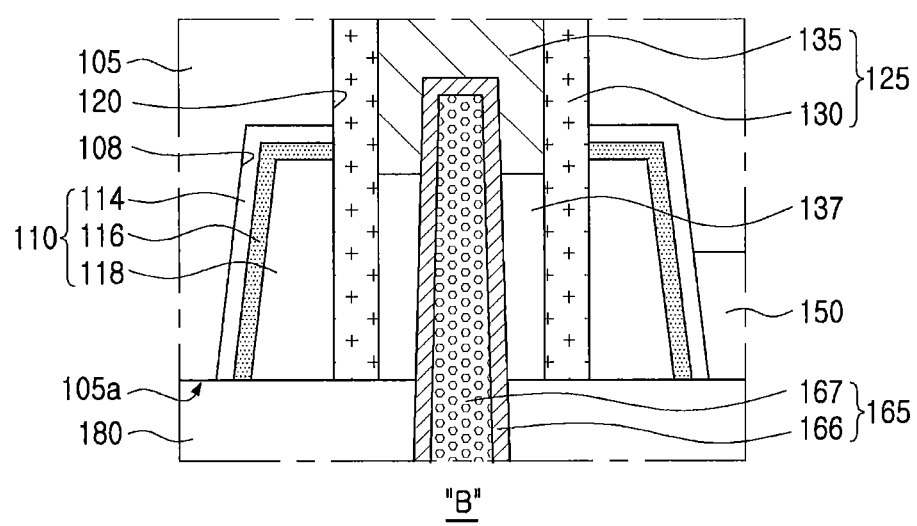
FIG. 5C is a modification of FIG. 5B.

In an example embodiment, the through electrode 135 may pass through the isolation region 110. However, example embodiments of the present inventive concept are not limited thereto. A modification of the through electrode 135 will be described with reference to FIG. 5C. FIG. 5C is a modification of FIG. 5B.

Referring to FIG. 5C, the through electrode 135 may be disposed in a portion recessed from the first surface 105a of the semiconductor substrate 105. The recessed portion may be filled with an insulating material 137. One of the front vias 165 included in the circuit interconnection region 155 may pass through the insulating material 137, and may be in contact with the through electrode 135.

Figure 6A:
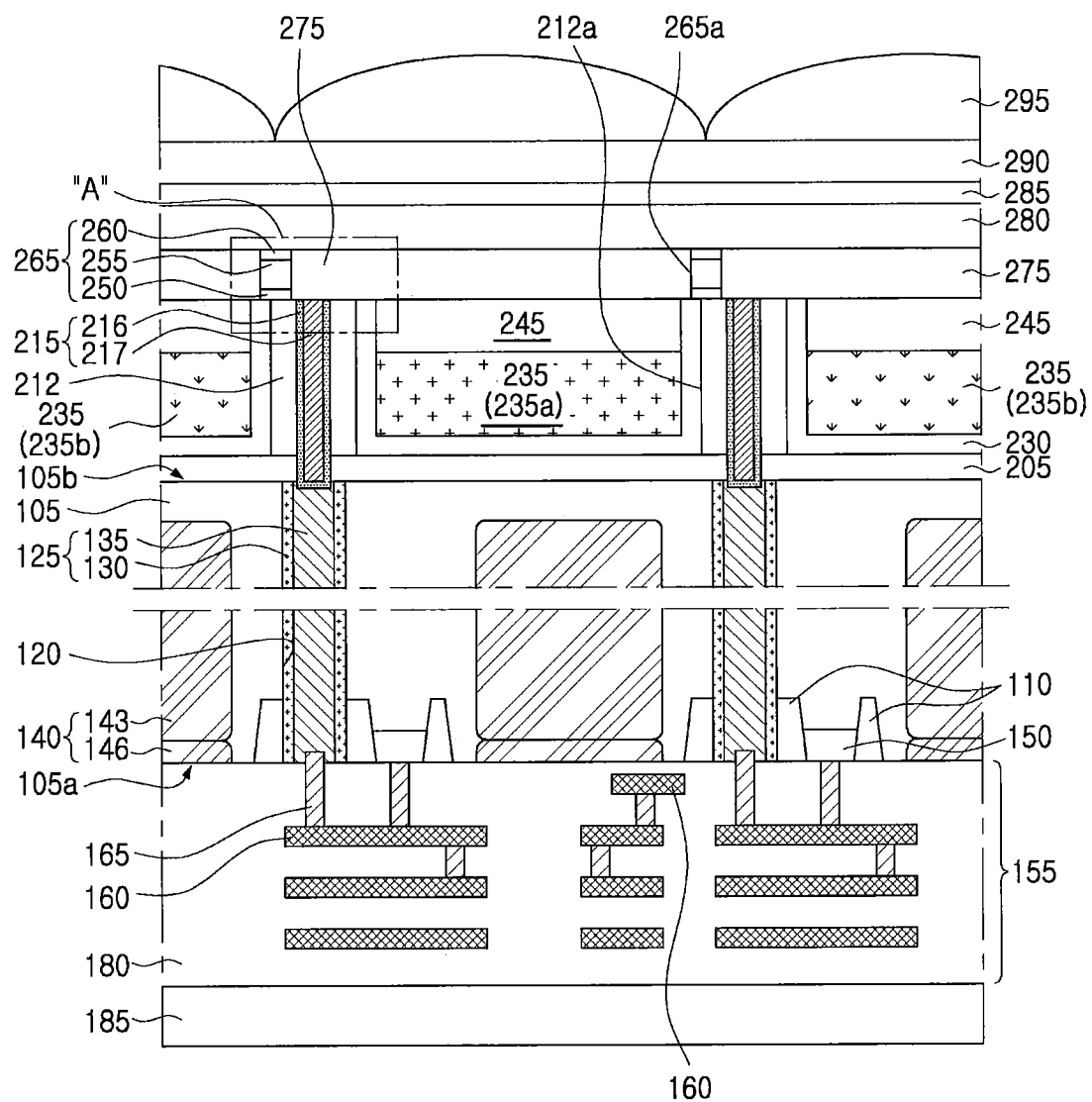
FIG. 6A is an image sensor according to an example embodiment.

A modification of the separation structure 265 described above with reference to FIG. 4 will be described with reference to FIG. 6A. FIG. 6A is a cross-sectional view taken along line I-I' of FIG. 3, illustrating an image sensor according to an example embodiment.

Referring to FIG. 6A, a separation structure 265 may include a first insulating layer 250, a second insulating layer 255, and a third insulating layer 260. The first and third insulating layers 250 and 260 may be formed of materials having etch selectivity with respect to the second insulating layer 255. For example, when the second insulating layer 255 is formed of an oxide-based insulating material, for example, a silicon oxide, the first and third insulating layers 250 and 260 may be formed of nitride-based insulating materials, for example, a silicon nitride. When the second insulating layer 255 is formed of a nitride-based insulating material, for example, a silicon nitride, the first and third insulating layers 250 and 260 may be formed of oxide-based insulating materials, for example, a silicon oxide.

Figure 6B:
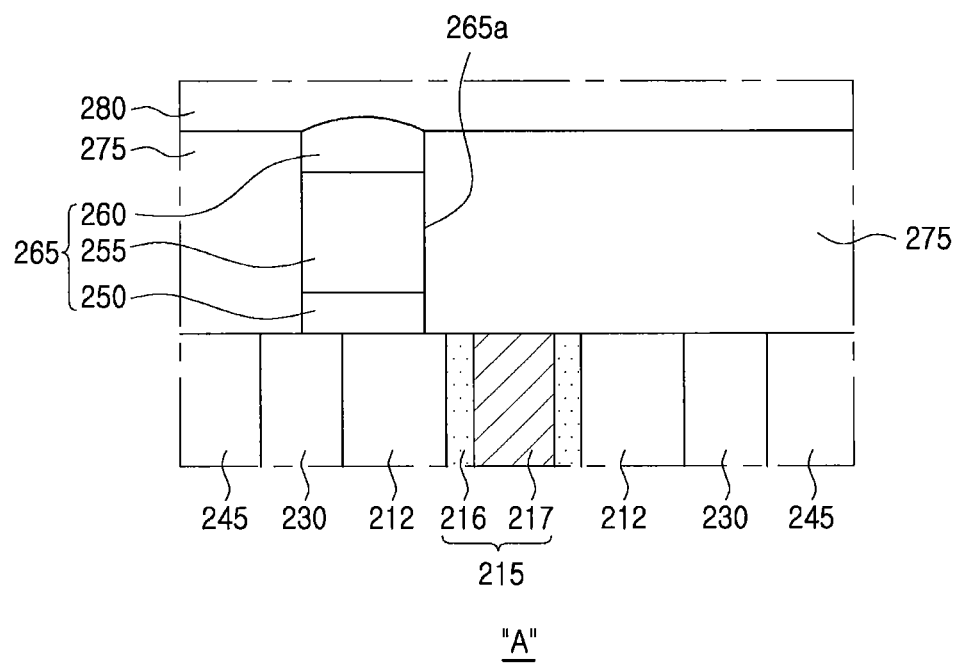
FIG. 6B is an enlarged view of region A of FIG. 6A.

An example of an image sensor, according to an example embodiment, will be described with reference to FIG. 6B. FIG. 6B is an enlarged view of region A, illustrating the example of the image sensor, according to an example embodiment.

Referring to FIG. 6B, at least a portion of the separation structure 265, adjacent to the upper surface of the separation structure 265, may be formed of a material harder than a first electrode 275. The separation structure 265 may have an upper surface continuously extending from an upper surface of the first electrode 275 without a stepped portion and forming a curved surface. For example, in a structure of the separation structure 265 described above with reference to 6A, the third insulating layer 260 may be formed of a material harder than the first electrode 275, for example, a nitride-based insulating material, and an upper surface of the third insulating layer 260 may be convex in an upward direction. Here, the term "upward direction" may refer to a direction in which the upper surface of the third insulating layer 260 is removed from the semiconductor substrate 105. The separation structure 265 may have an upper surface which is convex in the upward direction as being removed from the first electrode 275, while continuously extending from the upper surface of the first electrode 275. When the third insulating layer 260 is formed of a material softer than the first electrode 275, for example, a silicon oxide, the upper surface of the separation structure 265 may form a surface curved in a downward direction, similarly to the upper surface of the separation structure 265 described above with reference to 5A.

Figure 7A:
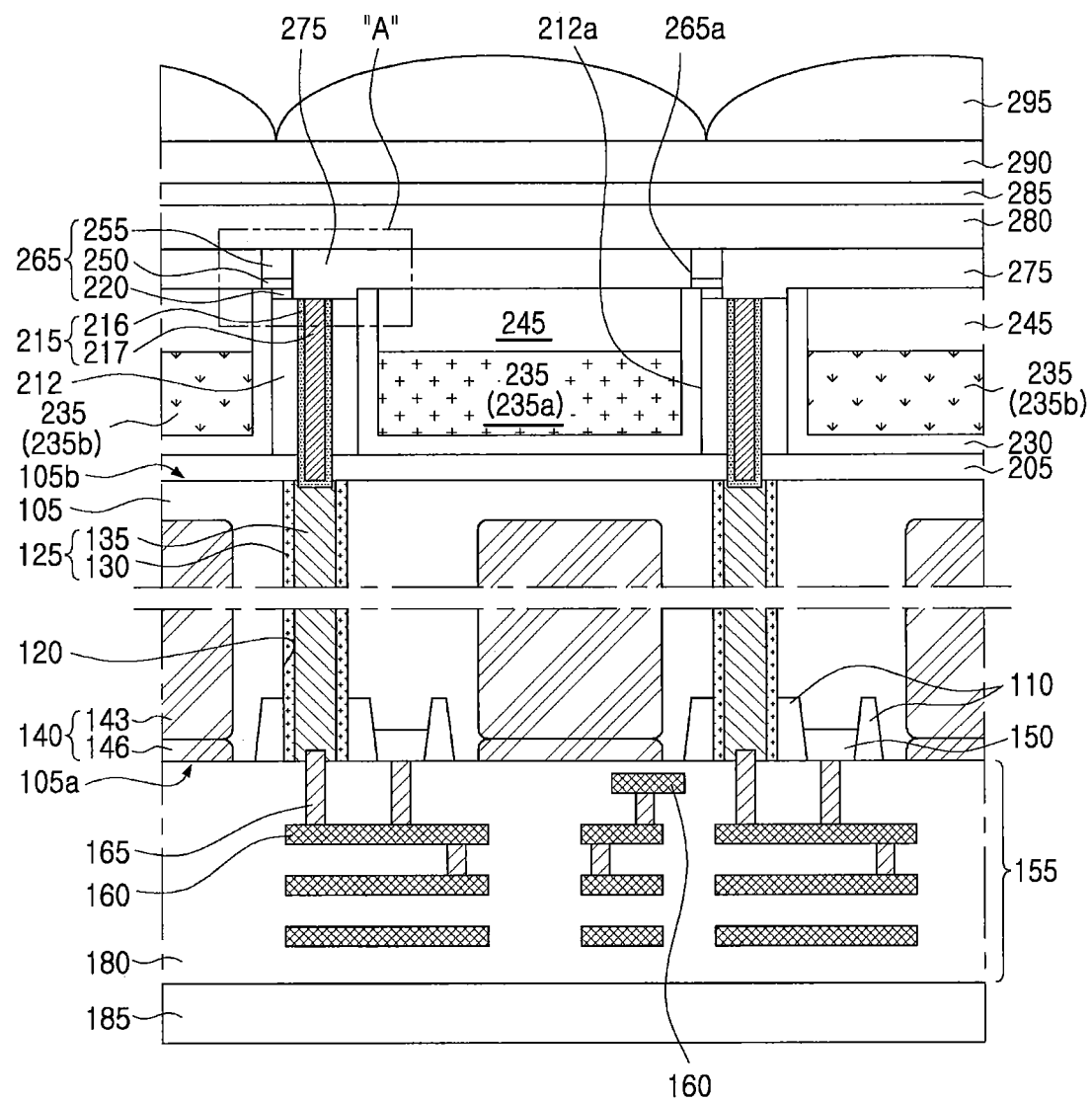
FIG. 7A is an image sensor according to an example embodiment.
Figure 7B:
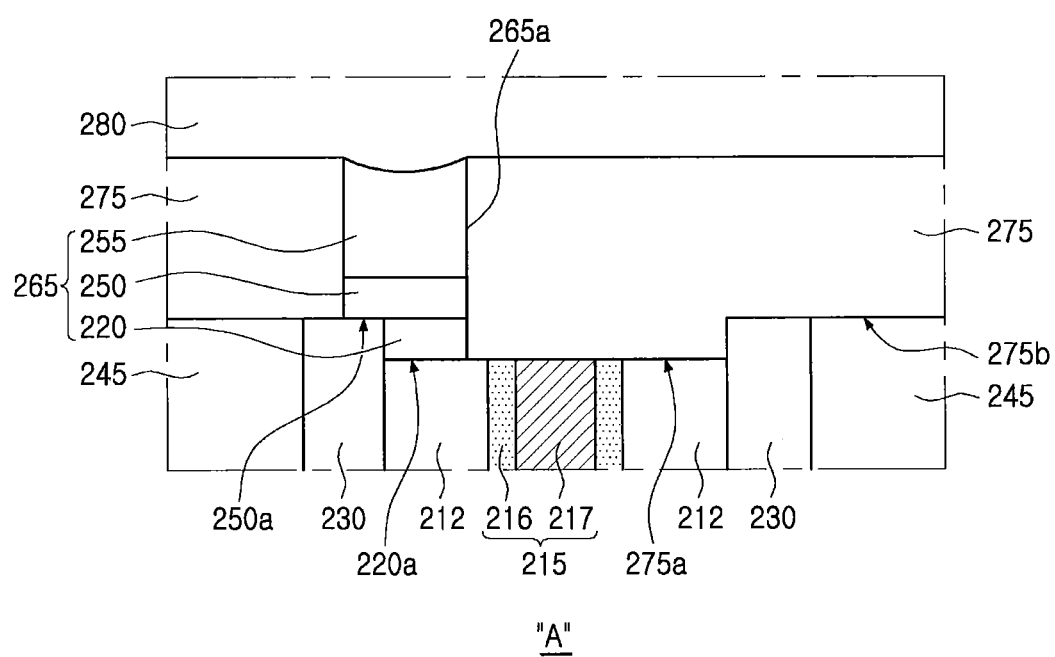
FIG. 7B is an enlarged view of region A of FIG. 7A.

A modification of the separation structure 265 described above with reference to FIG. 4 and components adjacent to the separation structure 265 will be described with reference to FIGS. 7A and 7B. FIG. 7A is a cross-sectional view taken along line I-I' of FIG. 3, illustrating an image sensor according to an example embodiment. FIG. 7B is an enlarged view of region A of FIG. 7A.

Referring to FIGS. 7A and 7B, a separation structure 265 may include sequentially stacked first and second insulating layers 250 and 255, and a base insulating layer 220 disposed below the first insulating layer 250. The base insulating layer 220 may be formed of a material having etch selectivity with respect to the insulating liners 230 and the capping insulating layers 245. For example, the base insulating layer 220 may be formed of a nitride-based insulating material, for example, a silicon nitride, and the insulating liners 230 and the capping insulating layers 245 may be formed of oxide-based insulating materials, for example, a silicon oxide.

The base insulating layer 220 may have a width less than that of the first insulating layer 250. The first and second insulating layers 250 and 255 may have the same width as each other, and may be aligned in a vertical direction. One of opposing side surfaces of the base insulating layer 220 may be aligned with one side surface of the first insulating layer 250 in a vertical direction, and the other of the opposing side surfaces of the base insulating layer 220 may be in contact with a lower surface of the first insulating layer 250.

The separation structure 265 may have a first lower surface 220a and a second lower surface 250a positioned on different levels. The first lower surface 220a of the separation structure 265 may be closer to a second surface 105b of a semiconductor substrate 105 than the second lower surface 250a of the separation structure 265. The first lower surface 220a of the separation structure 265 may be closer to contact plugs 215 than the second lower surface 250a of the separation structure 265.

The first lower surface 220a of the separation structure 265 may be a lower surface of the base insulating layer 220, and the second lower surface 250a of the separation structure 265 may be a lower surface of the first insulating layer 250 not being in contact with the base insulating layer 220.

The insulating pattern 212 and the contact plugs 215 may have upper surfaces coplanar with each other.

The capping insulating layers 245 and the insulating liners 230 may have upper surfaces coplanar with each other.

The upper surfaces of the insulating pattern 212 and the contact plugs 215 may be closer to the second surface 105b of the semiconductor substrate 105 than the upper surfaces of the capping insulating layers 245.

Each of first electrodes 275 disposed in second openings 265a of the separation structure 265 may have a first lower surface 275a and a second lower surface 275b positioned on different levels. In each first electrode 275, the first lower surface 275a may be closer to the second surface 105b of the semiconductor substrate 105 than the second lower surface 275b.

The first lower surfaces 220a of the first electrodes 275 may be in contact with the contact plugs 215 and the insulating pattern 212, and the second lower surfaces 275b of the first electrodes 275 may be in contact with the capping insulating layers 245.

The separation structure 265 may have an upper surface continuously extending from the upper surfaces of the first electrodes 275 without a stepped portion and forming a curved surface, curved in a downward direction.

As described above, the separation structure 265 may have the upper surface formed as the curved surface. Similarly, separation structures to be described with reference to the following example embodiments may also have upper surfaces formed as curved surfaces. Although not specifically described below, the separation structures to be described below may be understood as having upper surfaces formed as curved surfaces.

Figure 8:
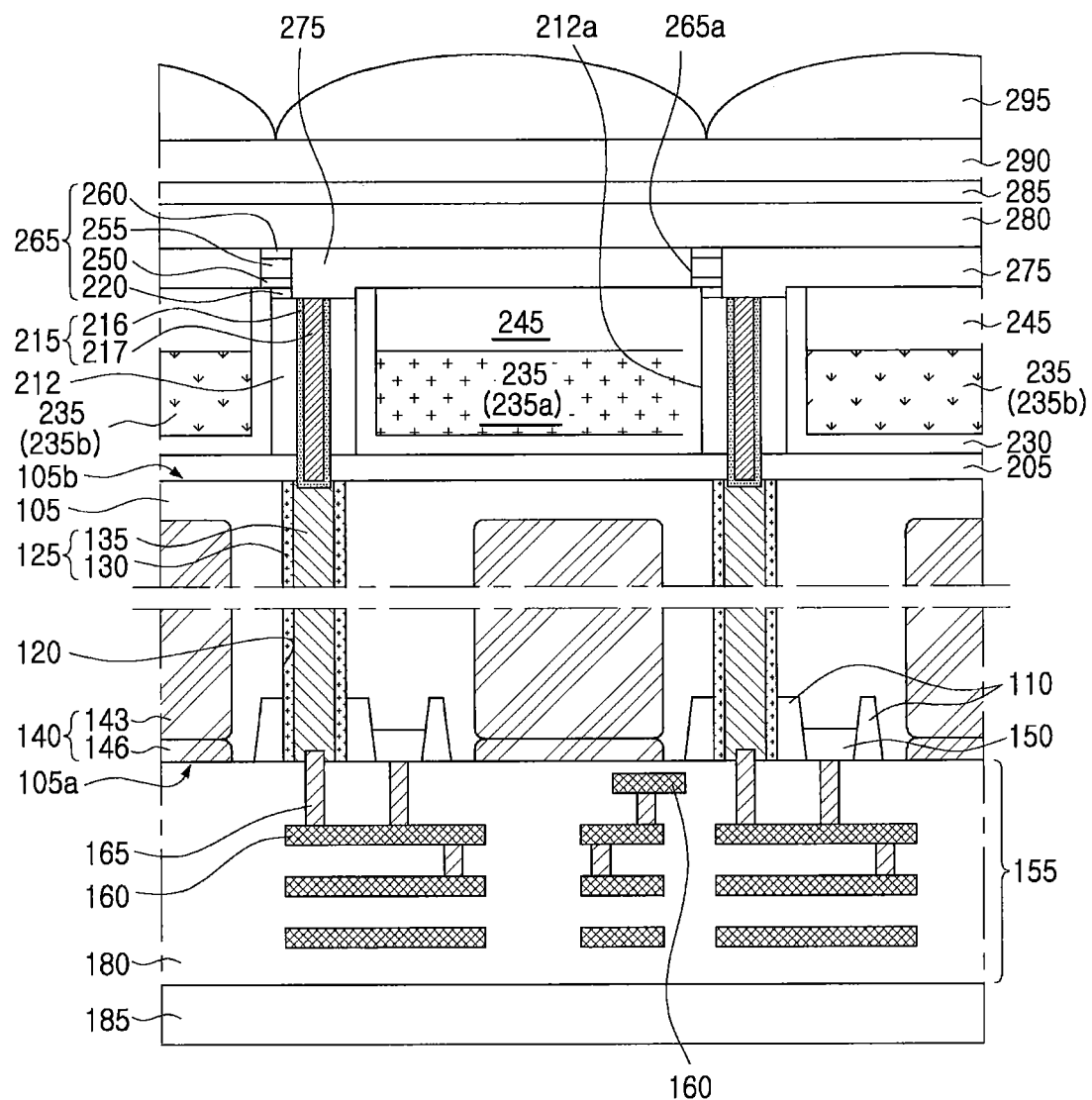
FIG. 8 is an image sensor according to an example embodiment.

A modification of the separation structure 265 described above with reference to FIGS. 7A and 7B will be described with reference to FIG. 8. FIG. 8 is a cross-sectional view taken along line I-I' of FIG. 3, illustrating an image sensor according to an example embodiment.

Referring to FIG. 8, a separation structure 265 may further include a third insulating layer 260 disposed on a second insulating layer 255, in addition to the base insulating layer 220, the first insulating layer 250, and the second insulating layer 255, described above with reference to FIGS. 7A and 7B. The third insulating layer 260 may be formed of a material having etch selectivity with respect to the second insulating layer 255.

Figure 9:
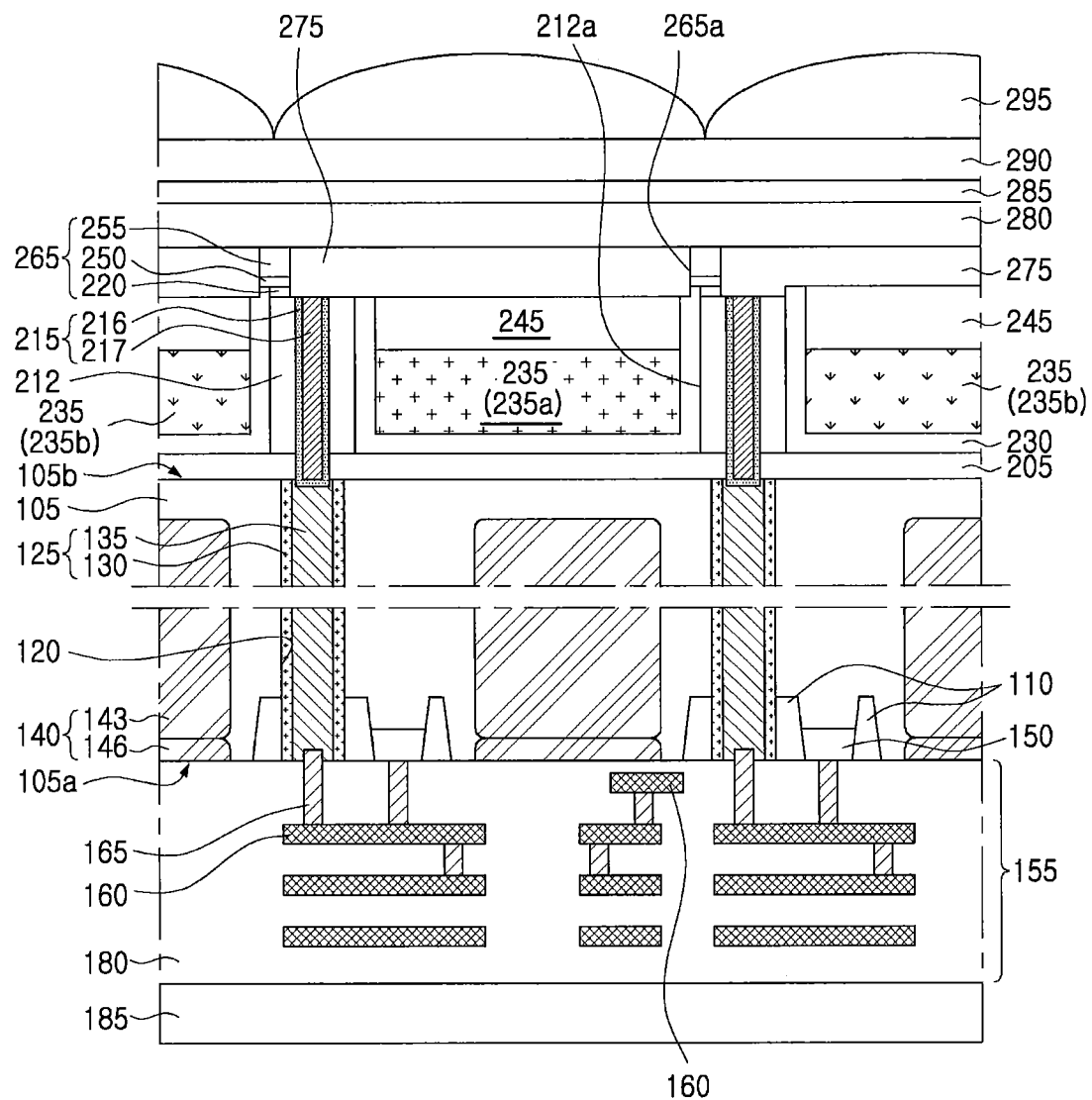
FIG. 9 is an image sensor according to an example embodiment.

A modification of the capping insulating layers 245, the insulating liners 230, and the first electrodes 275, described above with reference to FIGS. 7A and 7B, will be described with reference to FIG. 9. FIG. 9 is a cross-sectional view taken along line I-I' of FIG. 3, illustrating an image sensor according to an example embodiment.

Referring to FIG. 9, each of capping insulating layers 245 may have an upper surface coplanar with the upper surfaces of the insulating pattern 212 and the contact plugs 215. Each of insulating liners 230 may include a portion in contact with a lower surface of the separation structure 265, and a portion having an upper surface coplanar with the upper surface of the capping insulating layer 245. First electrodes 275 may be disposed in the second openings 265a of the separation structure 265, and may each have a substantially flat lower surface.

Figure 10:
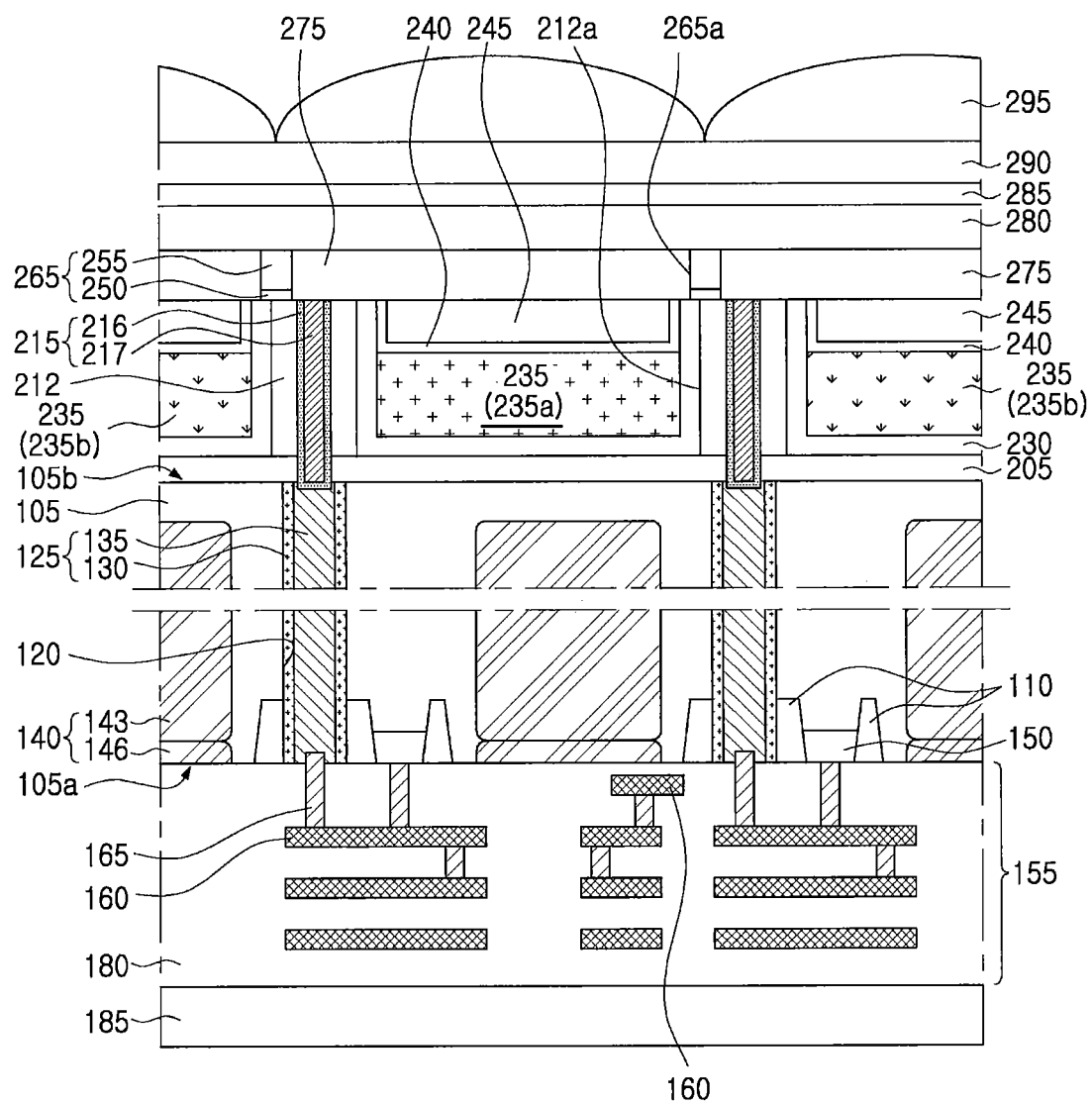
FIG. 10 is an image sensor according to an example embodiment.
Figure 11:
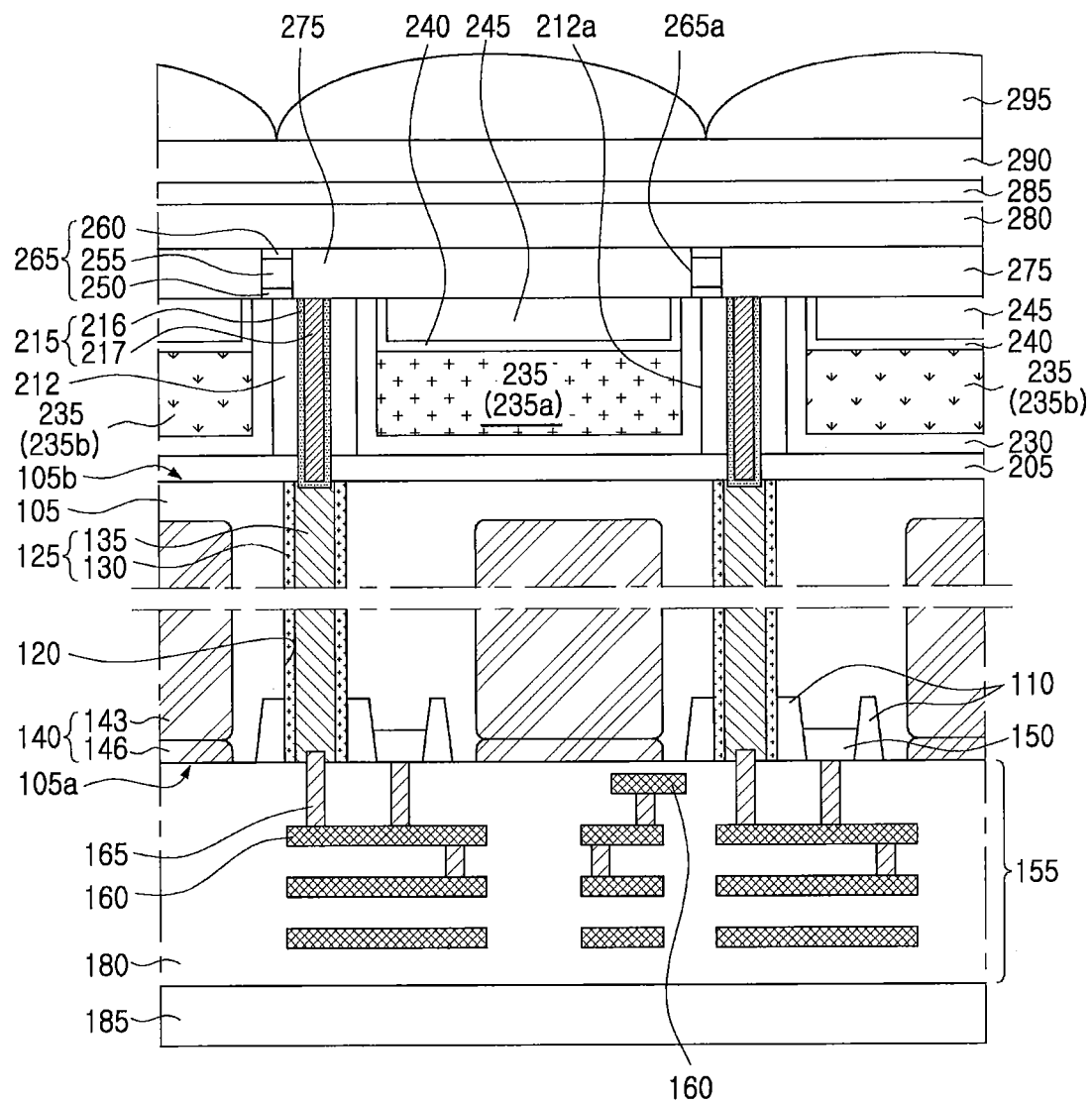
FIG. 11 is an image sensor according to an example embodiment.
Figure 12:
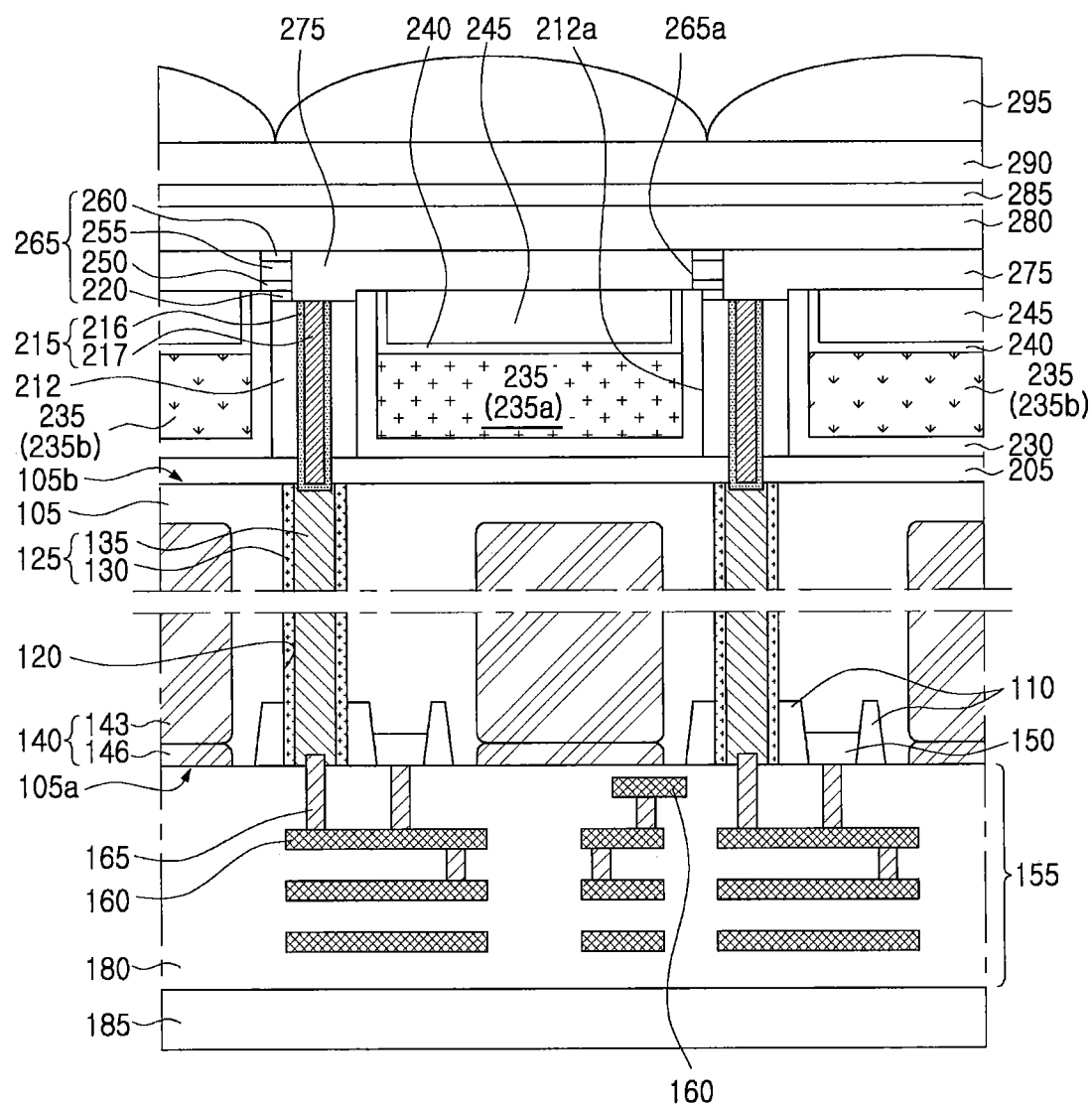
FIG. 12 is an image sensor according to an example embodiment.
Figure 13:
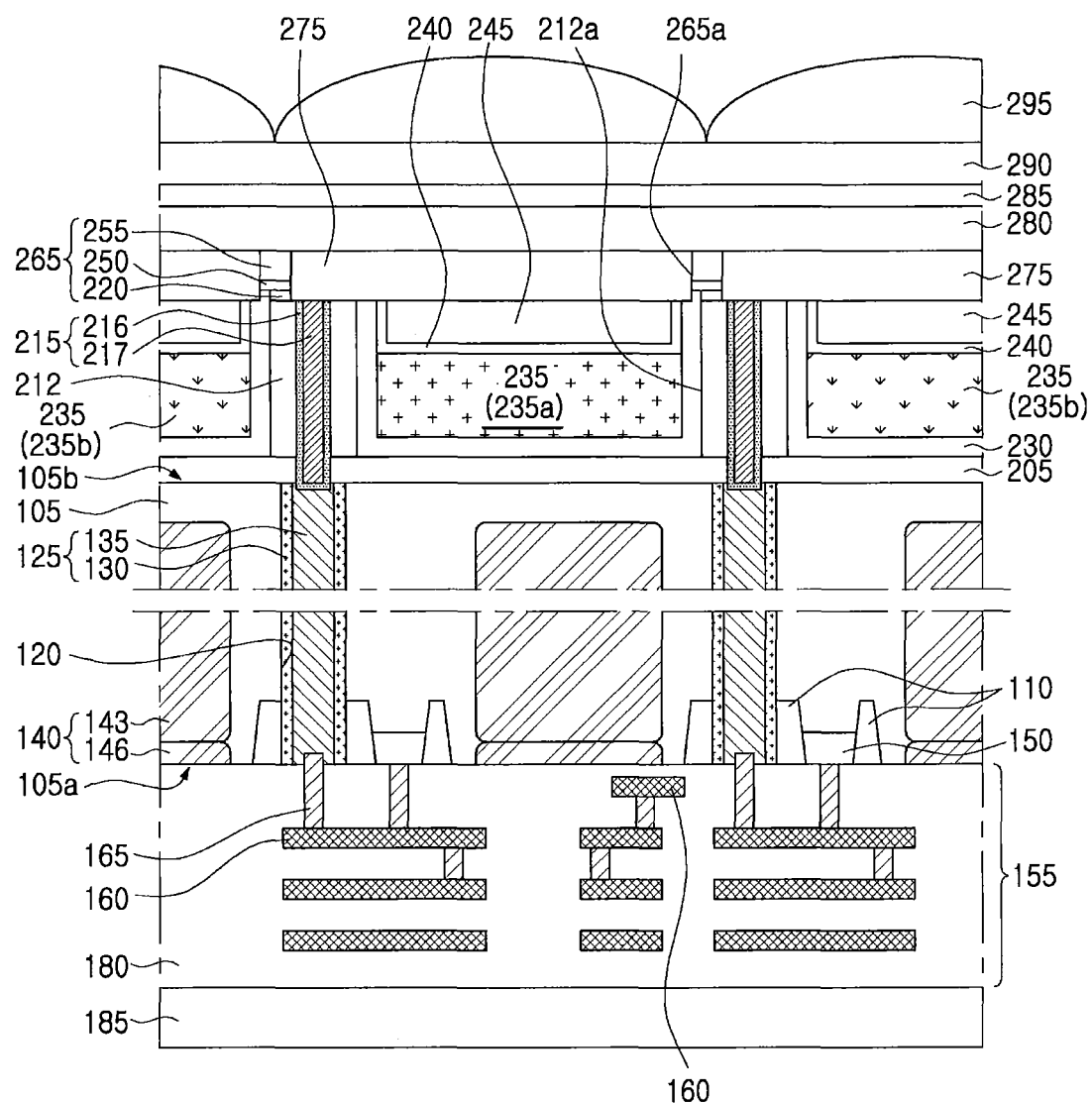
FIG. 13 is an image sensor according to an example embodiment.

As described above, the capping insulating layers 245 and the color filters 235 may be in contact with each other. However, example embodiments of the present inventive concept are not limited thereto. For example, one of the examples of the image sensor described above with reference to FIGS. 4 through 9 may be modified, such that the first capping insulating layers 245 may be spaced apart from the color filters 235. Various examples of the capping insulating layers 245 and the color filters 235 spaced apart from each other will be described with reference to FIGS. 10 through 14. FIG. 10 is a cross-sectional view taken along line I-I' of FIG. 3, illustrating a modification of the image sensor described above with reference to FIG. 4. FIG. 11 is a cross-sectional view taken along line I-I' of FIG. 3, illustrating a modification of the image sensor described above with reference to FIG. 6A. FIG. 12 is a cross-sectional view taken along line I-I' of FIG. 3, illustrating a modification of the image sensor described above with reference to FIG. 7A. FIG. 13 is a cross-sectional view taken along line I-I' of FIG. 3, illustrating a modification of the image sensor described above with reference to FIG. 9.

Referring to FIGS. 10 through 13, filter protection layers 240 may be disposed to be interposed between the capping insulating layers 245 and the color filters 235 and to extend onto side surfaces of the capping insulating layers 245. The filter protection layers 240 may be interposed between the capping insulating layers 245 and the insulating liners 230. Thus, the capping insulating layers 245 may be spaced apart from the color filters 235 by the filter protection layers 240. The filter protection layers 240 may have a material having etch selectivity with respect to the capping insulating layers 245. For example, the filter protection layers 240 may be formed of a silicon nitride, and the capping insulating layers 245 may be formed of a silicon oxide.

Figure 14:
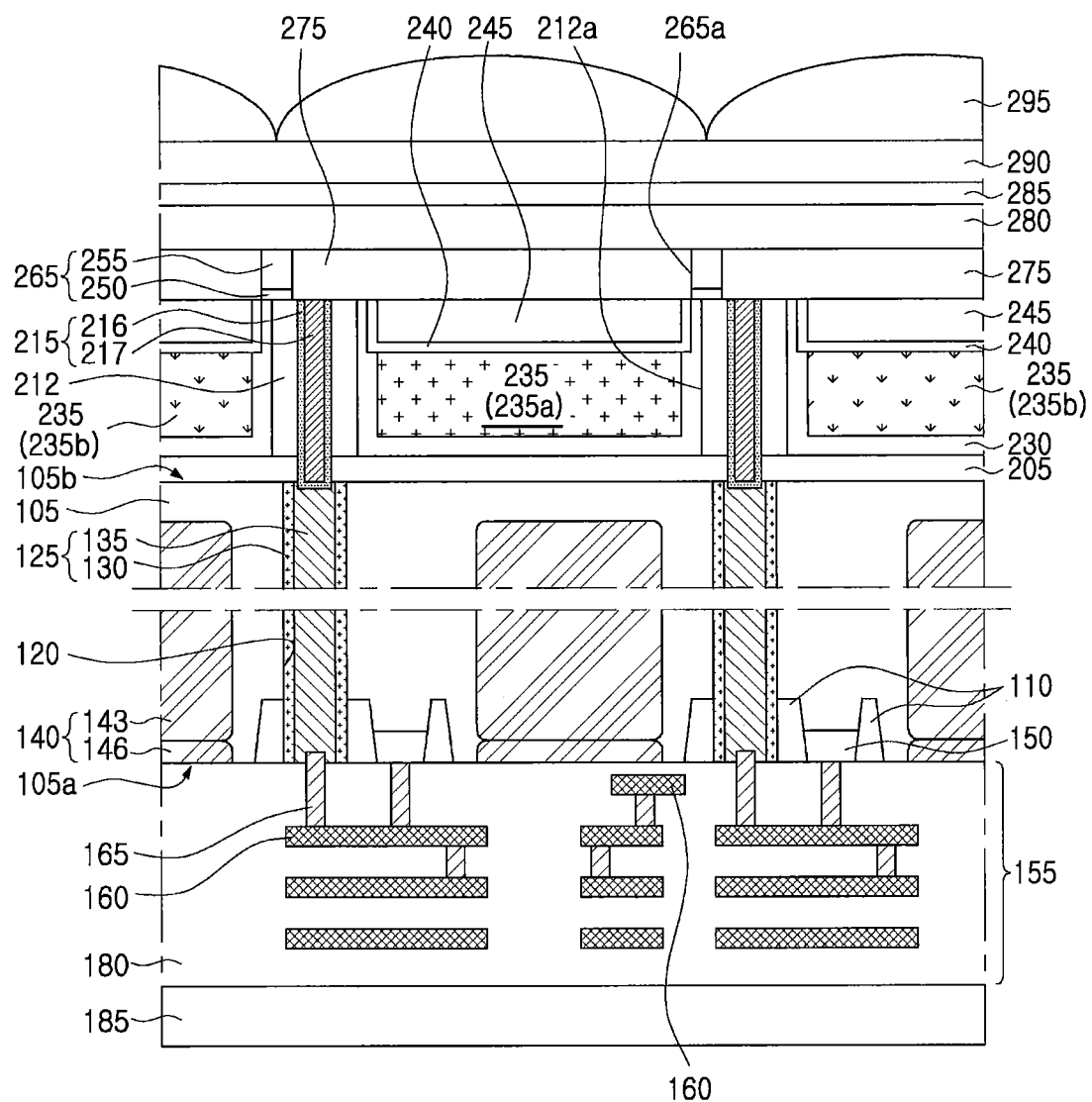
FIG. 14 is an image sensor according to an example embodiment.

A modification of the filter protection layers 240 described above with reference to FIGS. 10 through 13 will be described with reference to FIG. 14. FIG. 14 is a cross-sectional view illustrating a modification of the image sensor of FIG. 10, illustrating the modification of the filter protection layers 240 described above with reference to FIGS. 10 through 13.

Referring to FIG. 14, filter protection layers 240 may extend in a horizontal direction, while being interposed between capping insulating layers 245 and color filters 235, may extend into insulating liners 230, and may extend in a vertical direction to cover side surfaces of the capping insulating layers 245.

Figure 15:
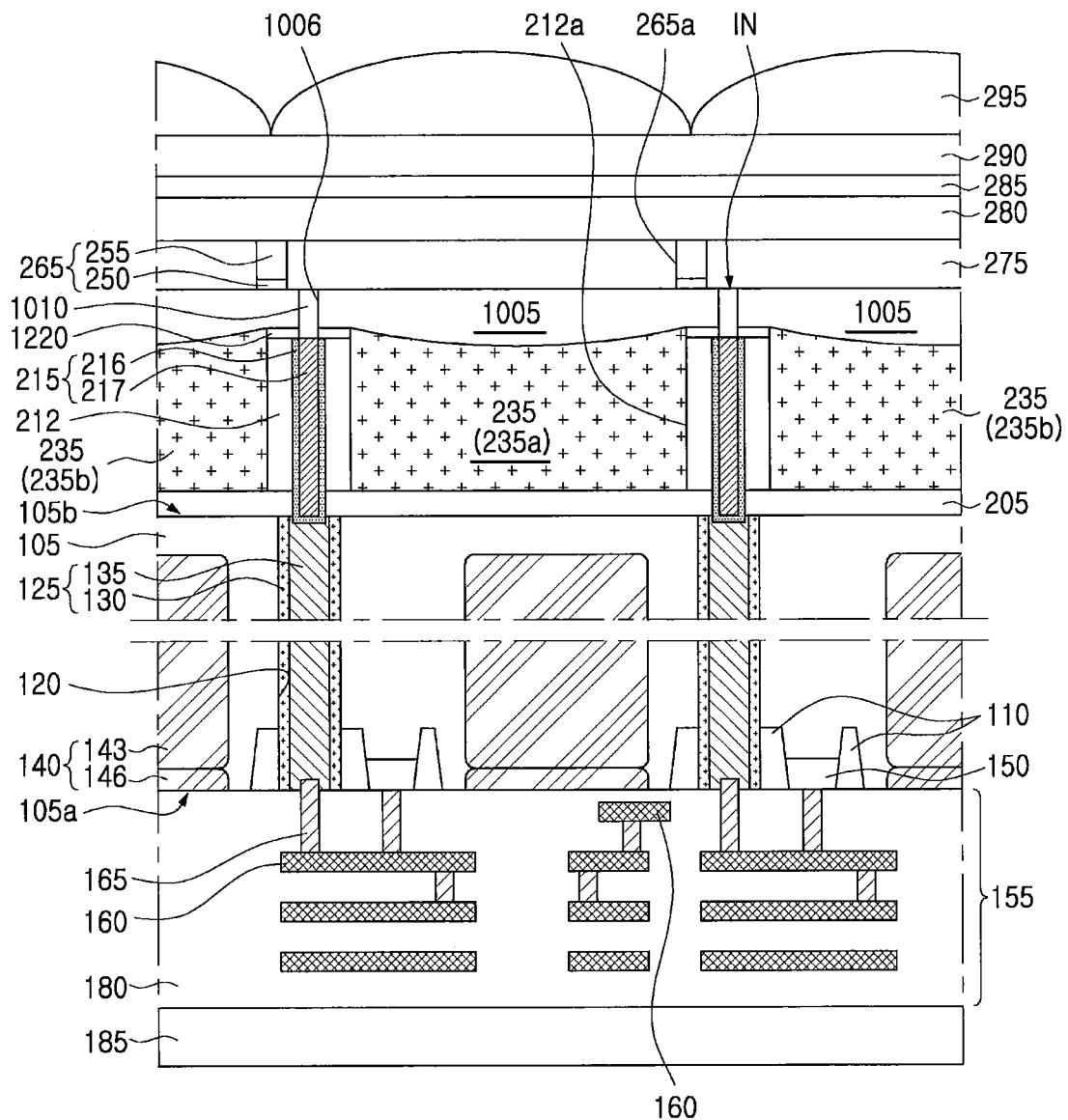
FIG. 15 is an image sensor according to an example embodiment.
Figure 16:
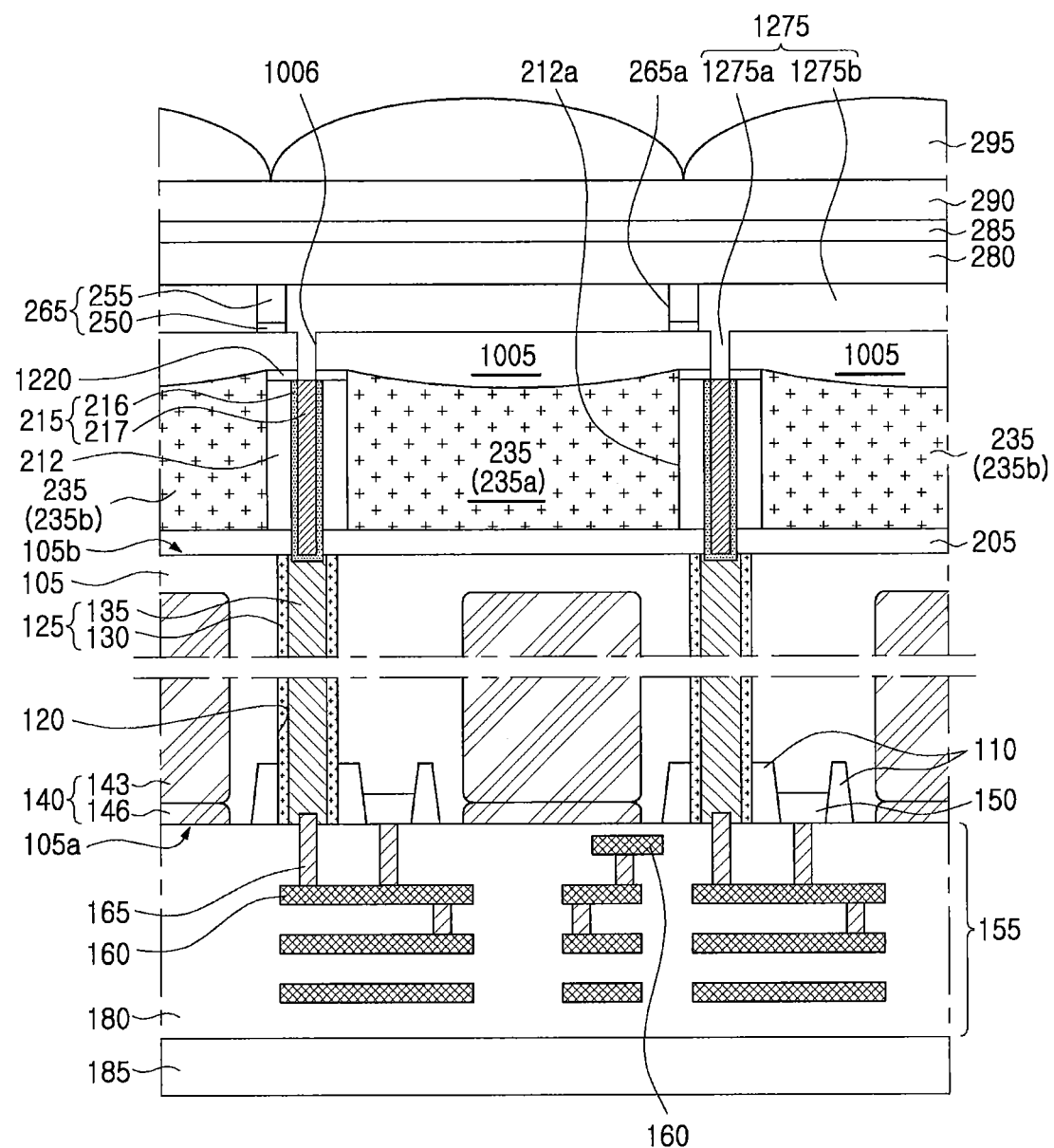
FIG. 16 is an image sensor according to an example embodiment.

Other modifications of an image sensor, according to an example embodiment, will be described with reference to FIGS. 15 and 16. FIG. 15 is a cross-sectional view taken along line LP of FIG. 3, illustrating another modification of the image sensor, according to an example embodiment. FIG. 16 is a cross-sectional view taken along line I-I' of FIG. 3, illustrating another modification of the image sensor, according to an example embodiment.

Referring to FIG. 15, a semiconductor substrate 105, photodiodes 140, through electrode structures 125, a circuit interconnection region 155, a support layer 185, an antireflective layer 205, an insulating pattern 212, and contact plugs 215, equal to those described above with reference to FIG. 4, may be provided.

Each of contact protection layers 1220 may be disposed on the insulating pattern 212, and may be aligned with the insulating pattern 212 in a vertical direction. The contact protection layer 1220 may prevent the contact plugs 215 from being damaged by an image sensor formation process. The contact protection layer 1220 may be formed of an insulating material having etch selectivity with respect to the insulating pattern 212. For example, the contact protection layer 1220 may be formed of a silicon nitride, and the insulating pattern 212 may be formed of a silicon oxide.

Color filters 235 may be disposed on the antireflective layer 205. The color filters 235 may be disposed in first openings 212a of the insulating pattern 212. The color filters 235 may include first color filters 235a, for example, red filters, and second color filters 235b, for example, blue filters.

In an example embodiment, each of the color filters 235 may have an upper surface having a downwardly concave shape. For example, each color filter 235 may have an upper surface recessed in a downward direction from the edges of the contact protection layer 1220, while continuously extending from an upper surface of the contact protection layer 1220.

A capping insulating layer 1005 may be disposed on the contact protection layer 1220 and the color filter 235. The capping insulating layer 1005 may extend onto the upper surface of the contact protection layer 1220, while covering the upper surface of the color filter 235. The capping insulating layer 1005 may be formed of a silicon oxide. The capping insulating layer 1005 may have a flat upper surface.

Each of holes 1006 may be formed through the capping insulating layer 1005 and the contact protection layer 1220, and may expose each of the contact plugs 215. Conductive vias 1010 may be disposed in the holes 1006. The conductive vias 1010 may also be referred to as a "rear via" or an "electrode via."

In an example embodiment, the conductive vias 1010 may be formed of a metal nitride, such as TiN or TaN. Alternatively, the conductive vias 1010 may also be formed of a transparent electrode material.

The capping insulating layer 1005 may have a separation structure 265 and first electrodes 275 disposed thereon and having the same structures as those described above with reference to FIG. 4. The separation structure 265 may include a first insulating layer 250 and a second insulating layer 255 equal to those described above with reference to FIG. 4, and the first and second insulating layers 250 and 255 may be stacked sequentially, and may have etch selectivity with respect to each other. The first electrodes 275 may be disposed in second openings 265a of the separation structure 265, may be electrically connected to the conductive vias 1010, while being in contact with the conductive vias 1010, and may overlap the color filters 235. The first electrodes 275 may form interfaces IN with the conductive vias 1010.

The conductive vias 1010 may be disposed between the first electrodes 275 and the contact plugs 215, while passing through the capping insulating layers 1005 and the contact protection layers 1220. The first electrodes 275 and the contact plugs 215 may be in contact with the conductive vias 1010. The first electrodes 275 and the contact plugs 215 may be electrically connected through the conductive vias 1010.

The photoelectric layer 280, the second electrode 285, the cover insulating layer 290, and the microlenses 295, described above with reference to FIG. 4, may be disposed on the separation structure 265 and the first electrodes 275.

The conductive vias 1010 may be formed using a process different from that of forming the first electrodes 275, and may form the interfaces IN with the first electrodes 275.

However, example embodiments of the present inventive concept are not limited thereto. For example, in a modification, as illustrated in FIG. 16, first electrodes 1275 each including a conductive via portion 1275a corresponding to each of the conductive vias 1010 of FIG. 15 and an electrode portion 1275b corresponding to each of the first electrodes 275 of FIG. 15 may also be provided. In each first electrode 1275 of FIG. 16, the conductive via portion 1275a and the electrode portion 1275b may be formed integrally. The conductive via portion 1275a of the first electrode 1275 may also be referred to as a "conductive via," and the electrode portion 1275b of the first electrode 1275 may also be referred to as a "transparent electrode."

An upper surface of the separation structure 265 may be formed as a surface curved in a direction toward the semiconductor substrate 105, while continuously extending from the upper surfaces of the first electrodes 275 without a stepped portion, as illustrated in FIG. 5A.

The following will describe methods of forming various examples of the image sensor according to an example embodiment described above, with reference to FIGS. 17A through 17H, 18A, 18B, 19A through 19F, 20A, 20B, 21A through 21E, and 22A through 22C. FIGS. 17A through 17H, 18A, 18B, 19A through 19F, 20A, 20B, 21A through 21E, and 22A through 22C are cross-sectional views taken along line I-I' of FIG. 3, illustrating the methods of forming various examples of the image sensor according to an example embodiment.

First, an example of a method of forming a structure of the image sensor described above with reference to FIGS. 3 and 4 will be described with reference to FIGS. 17A through 17H.

Figure 17A:
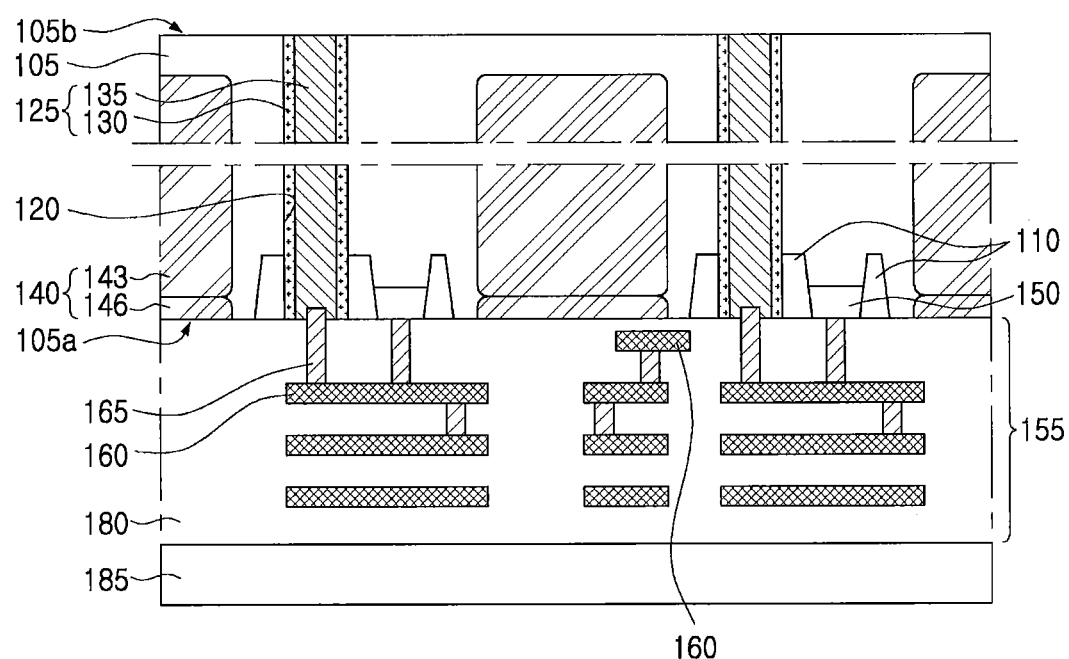
FIGS. 17A through 17H are cross-sectional views illustrating a method of forming an image sensor according to an example embodiment.

Referring to FIGS. 3 and 17A, an isolation region 110 may be formed on a first surface 105a of a semiconductor substrate 105. The isolation region 110 may be a trench isolation region.

Through holes 120 may be formed through a portion of the isolation region 110, and may extend into the semiconductor substrate 105. Through electrode structures 125 may be formed in the through holes 120. The forming of the through electrode structures 125 may include forming insulating spacers 130 on inner walls of the through holes 120 and forming through electrodes 135 filling the through holes 120. The through electrodes 135 may be formed of polysilicon.

An ion implantation process may be performed on the first surface 105a of the semiconductor substrate 105 to form storage node regions 150 and photodiodes 140. In an example embodiment, the storage node regions 150 may have n-type conductivity. Each of the photodiodes 140 may include a first impurity region 143 and a second impurity region 146 having different conductivity types. For example, one of the first impurity region 143 and the second impurity region 146 may have n-type conductivity, and the other of the first impurity region 143 and the second impurity region 146 may have n-type conductivity may have p-type conductivity.

A circuit interconnection region 155 may be disposed on the first surface 105a of the semiconductor substrate 105. The circuit interconnection region 155 may include wiring layers 160 and front vias 165 forming a gate and wirings of a pixel circuit, and a front insulating structure 180 covering the wiring layers 160 and the front vias 165. A support layer 185 may be disposed on the circuit interconnection region 155.

Subsequent to forming the support layer 185, a grinding process or a back-grinding process for reducing a thickness of the semiconductor substrate 105 may be performed to expose the through electrodes 135 of the through electrode structures 125. As the thickness of the semiconductor substrate 105 decreases, an exposed surface of each of the through electrode structures 125 may be defined as a second surface 105b. The second surface 105b of the semiconductor substrate 105 may oppose the first surface 105a on which the circuit interconnection region 155 is formed.

Figure 17B:
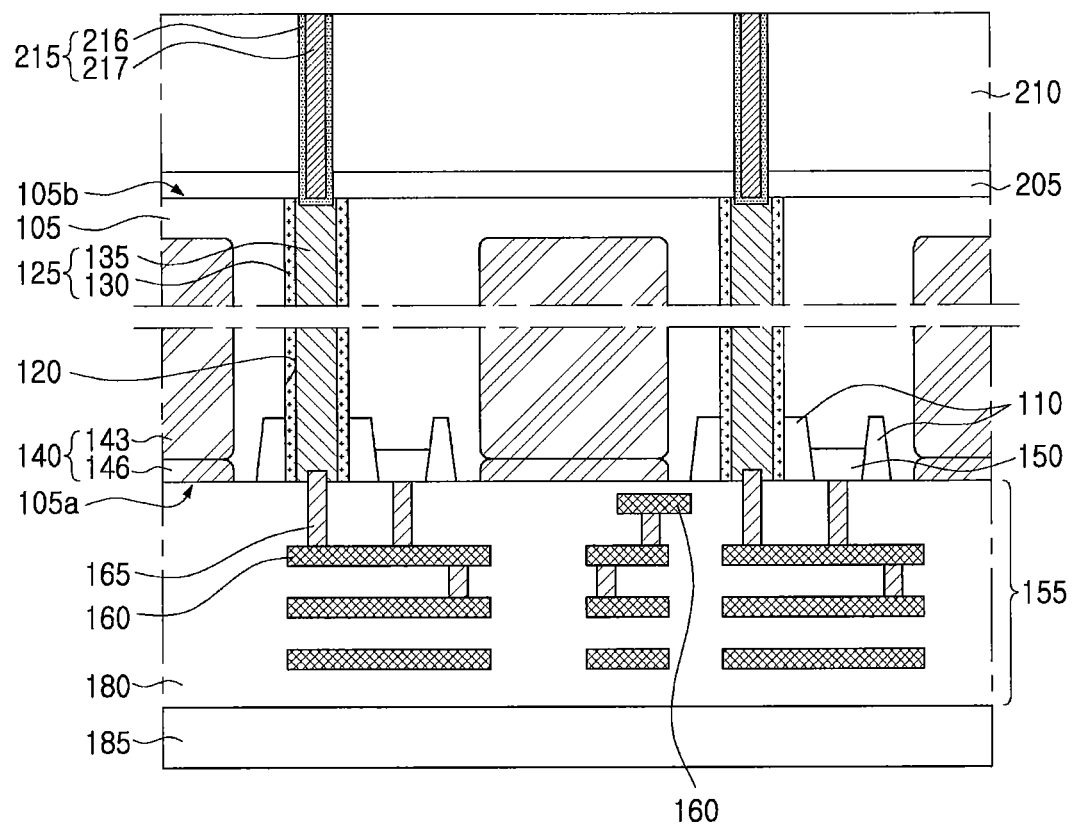

Referring to FIGS. 3 and 17B, an antireflective layer 205 may be formed on the second surface 105b of the semiconductor substrate 105. An insulating layer 210 may be formed on the antireflective layer 205 to have a thickness greater than that of the antireflective layer 205.

Contact plugs 215 may be formed to pass sequentially through the insulating layer 210 and the antireflective layer 205, and may be in contact with the through electrodes 135. Each of the contact plugs 215 may include a plug portion 217 and a barrier layer 216 covering a side surface and a bottom surface of the plug portion 217.

Figure 17C:
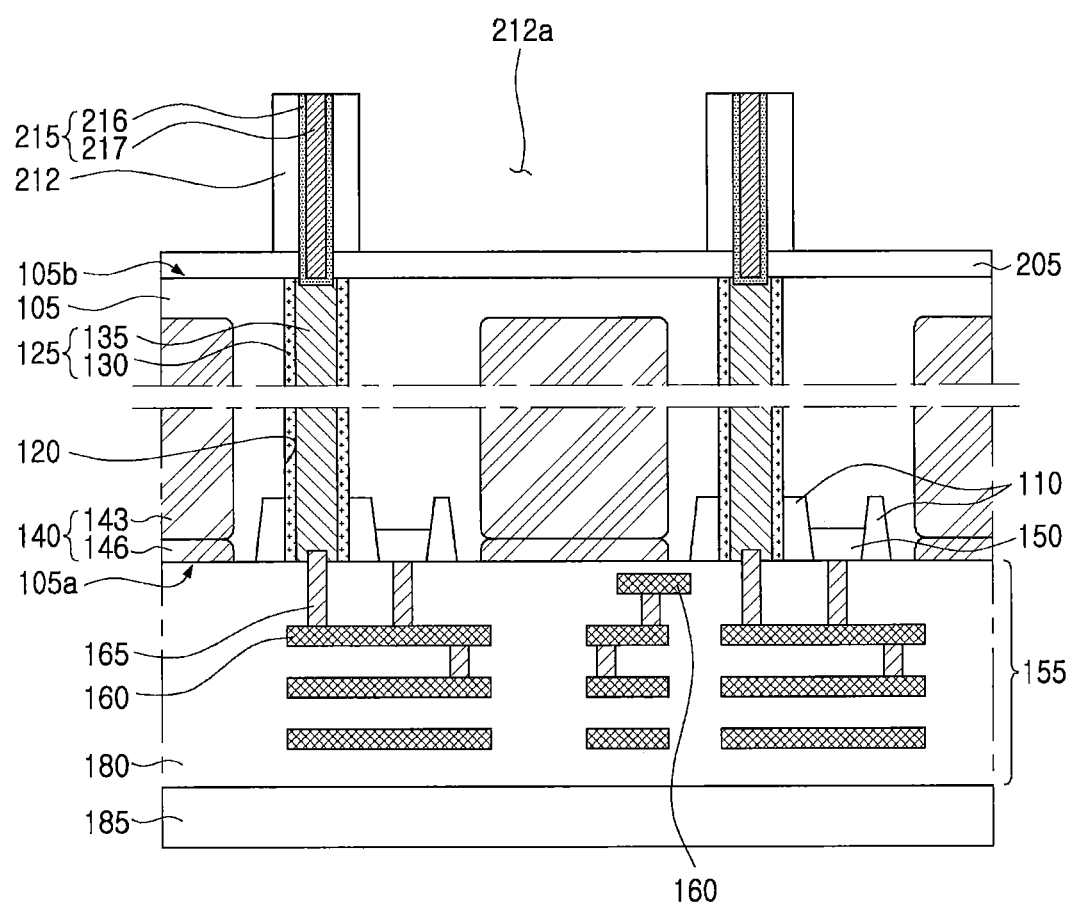

Referring to FIGS. 3 and 17C, the insulating layer 210 of FIG. 17B may be patterned to form an insulating pattern 212 having first openings 212a. Each of the first openings 212a may overlap the photodiodes 140. The contact plugs 215 may remain, to pass through the insulating pattern 212. The first openings 212a of the insulating pattern 212 may expose the antireflective layer 205.

Figure 17D:
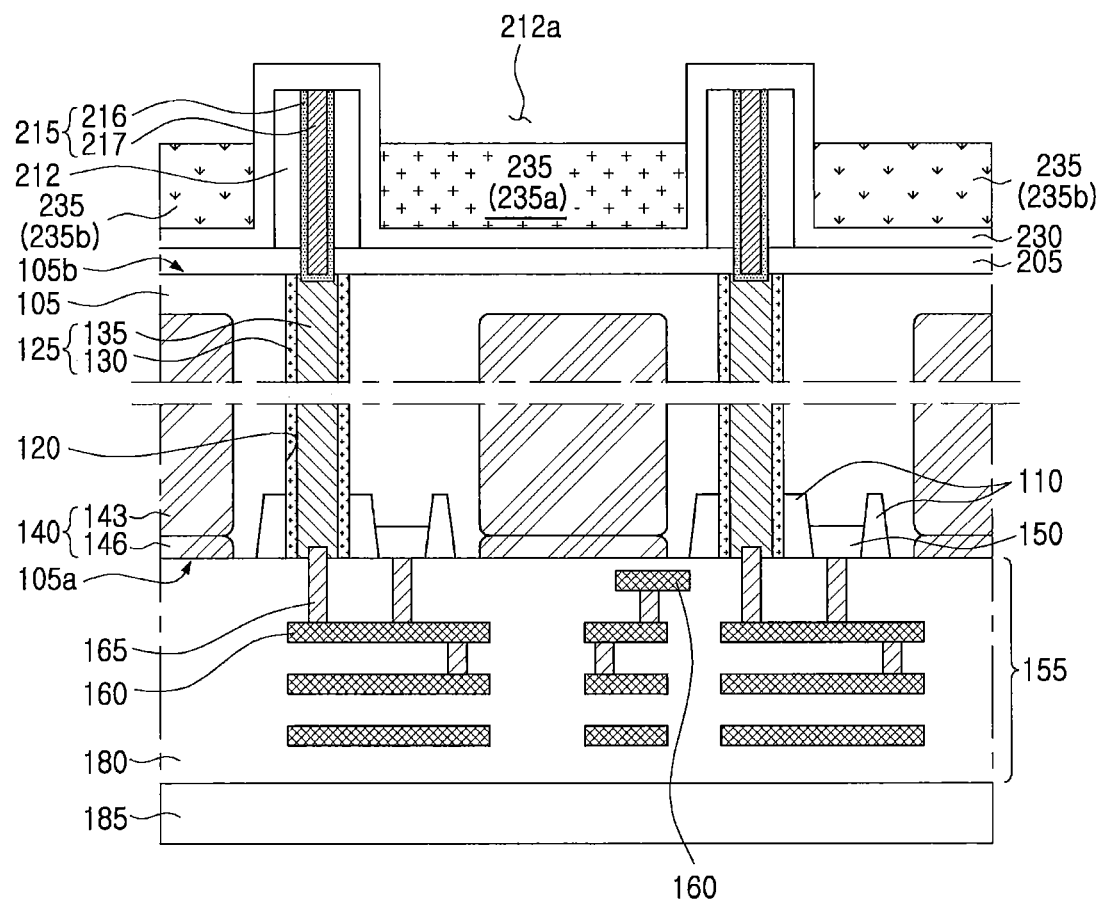

Referring to FIGS. 3 and 17D, an insulating liner 230 may be formed to conformally cover the insulating pattern 212 and the antireflective layer 205. The insulating liner 230 may be formed of a silicon oxide. Color filters 235 may be formed on the insulating liner 230 to fill portions of the first openings 212a.

Figure 17E:
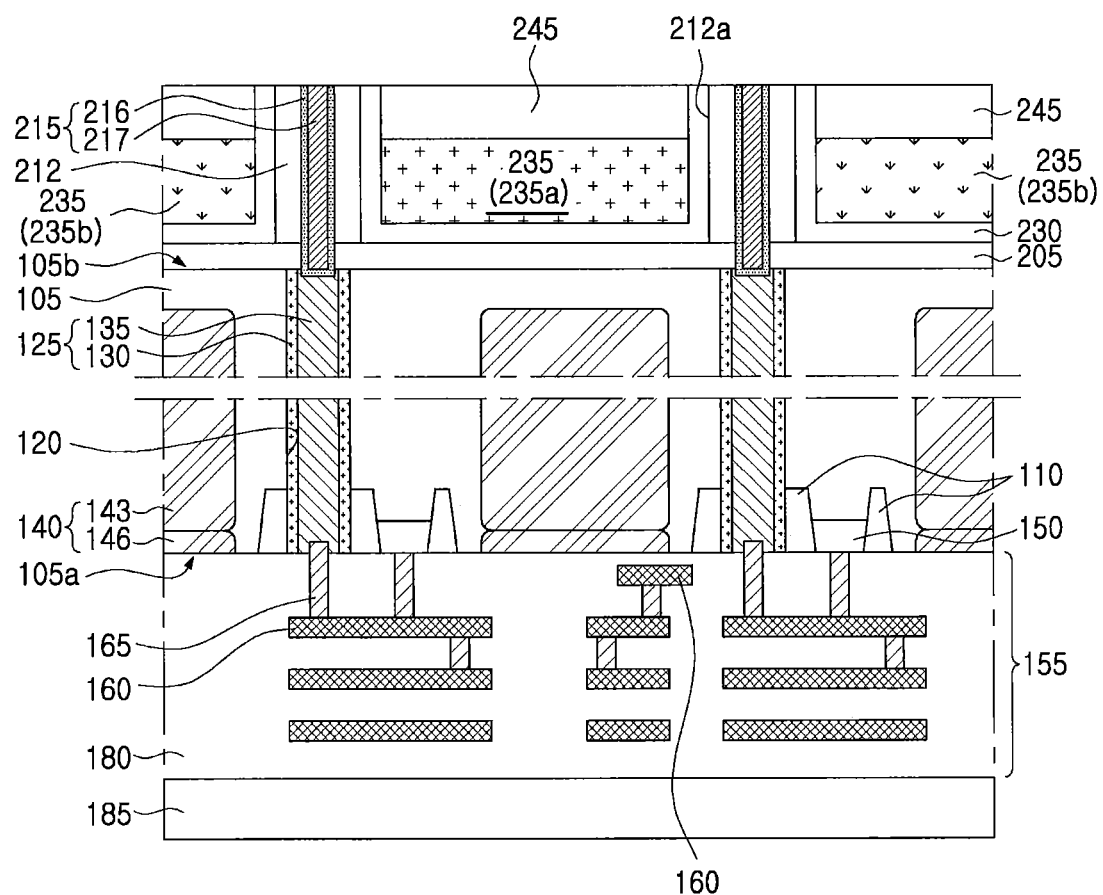

Referring to FIGS. 3 and 17E, capping insulating layers 245 may be formed on the color filters 235. The forming of the capping insulating layers 245 may include forming a capping layer on the second surface 105b of the semiconductor substrate 105 having the color filters 235, and planarizing the capping layer until the through electrode structures 125 are exposed. The insulating liner 230 may remain in the first openings 212a of the insulating pattern 212, while planarizing the capping layer, and may be formed as a plurality of insulating liners 230 spaced apart from one another.

Figure 17F:
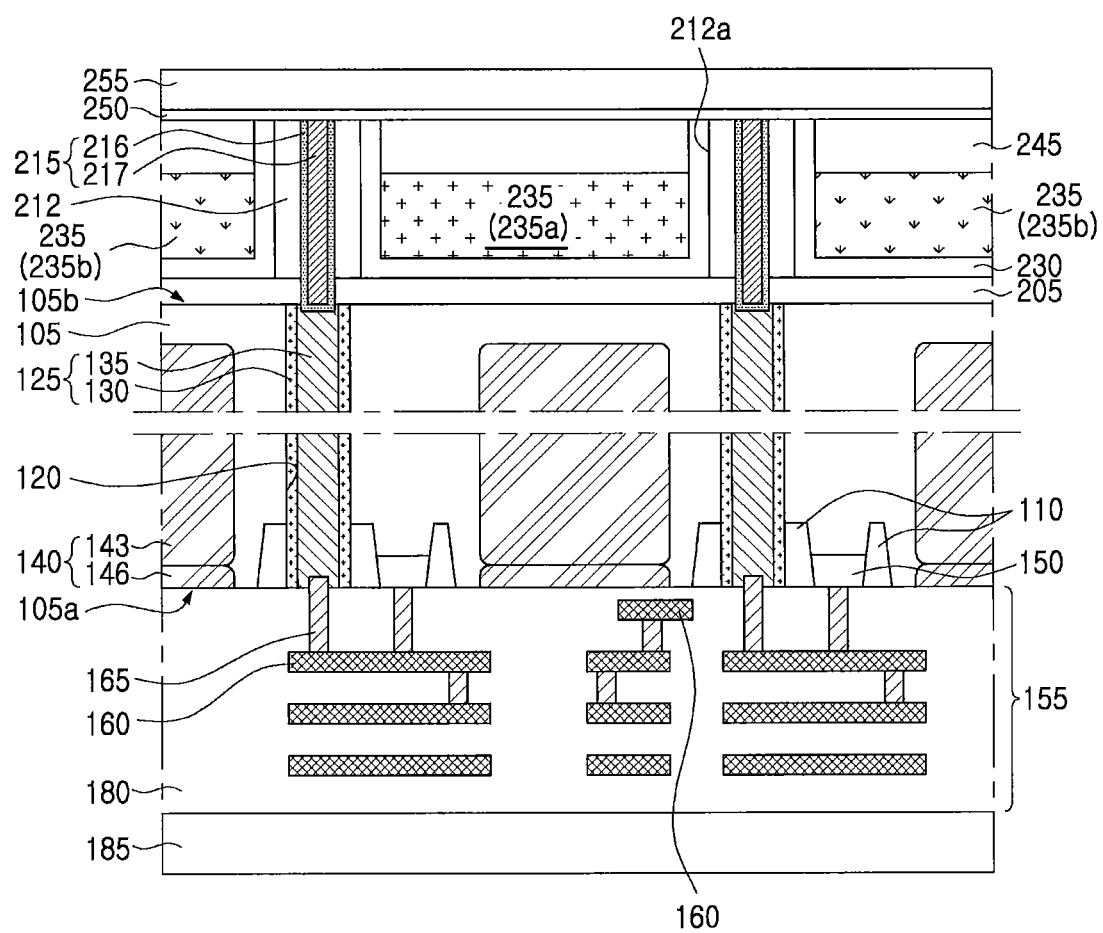

Referring to FIGS. 3 and 17F, a first insulating layer 250 and a second insulating layer 255 may be formed on the capping insulating layers 245 and the insulating pattern 212 to be stacked sequentially thereon.

The first insulating layer 250 may be formed of a material having etch selectivity with respect to the second insulating layer 255, the capping insulating layers 245, the insulating pattern 212, and the insulating liners 230. For example, the first insulating layer 250 may be formed of a silicon nitride, and the second insulating layer 255, the capping insulating layers 245, the insulating pattern 212, and the insulating liners 230 may be formed of silicon oxides.

Figure 17G:
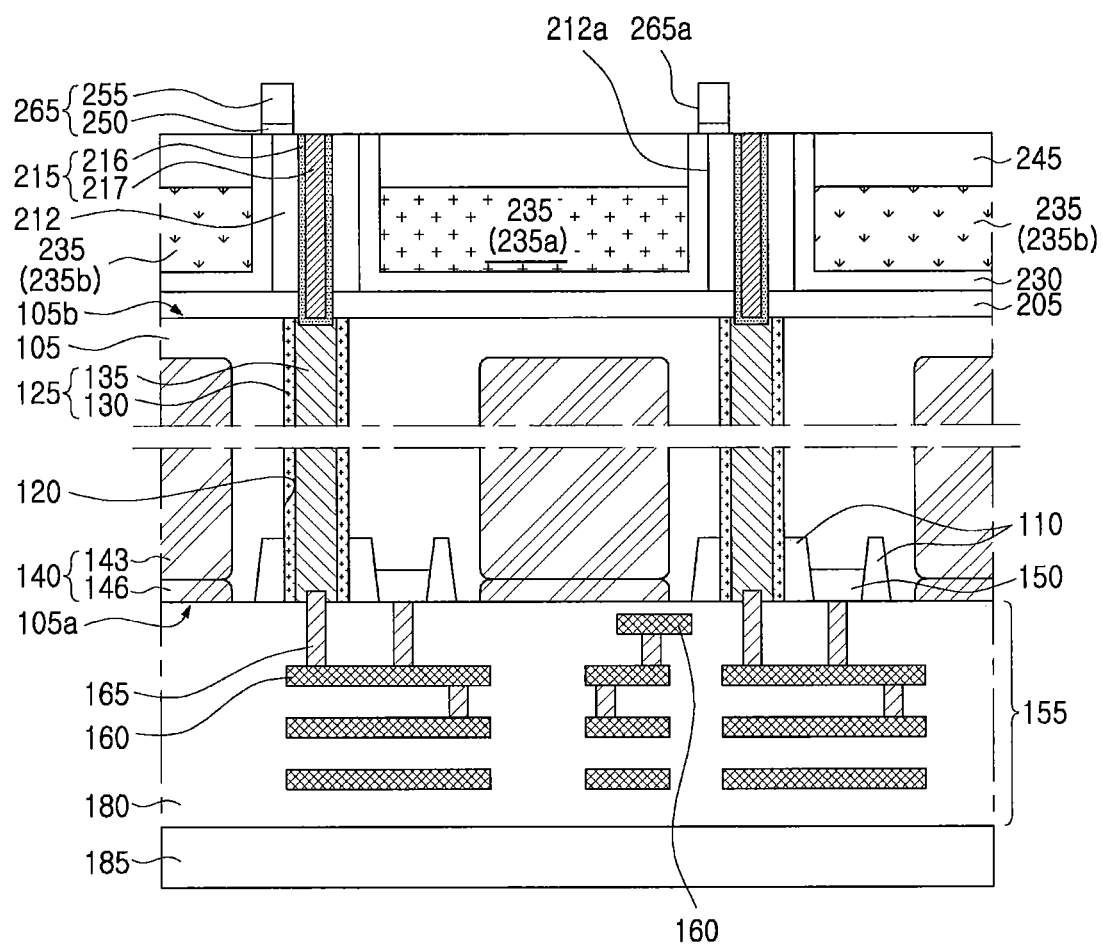

Referring to FIGS. 3 and 17G, the first and second insulating layers 250 and 255 may be patterned to form a separation structure 265 having second openings 265a. The second openings 265a of the separation structure 265 may expose the contact plugs 215, and may overlap the color filters 235. The separation structure 265 may be formed of the remaining first insulating layer 250 and the remaining second insulating layer 255. In an example embodiment, the separation structure 265 may be in contact with the insulating pattern 212 and the insulating liners 230.

The forming of the separation structure 265 having the second openings 265a by patterning the first and second insulating layers 250 and 255 may include exposing the first insulating layer 250 by patterning the second insulating layer 255, and etching the exposed first insulating layer 250.

Since the first insulating layer 250 may be formed of a material having etch selectivity with respect to the second insulating layer 255, the capping insulating layers 245, the insulating pattern 212, and the insulating liners 230, the first insulating layer 250 may be etched selectively. Thus, the capping insulating layers 245 may be prevented from being damaged by etching, while forming the separation structure 265. As a result, a reduction or deterioration in resolution of the image sensor that may occur due to etching damage to the capping insulating layers 245 protecting the color filters 235 may be prevented.

Figure 17H:
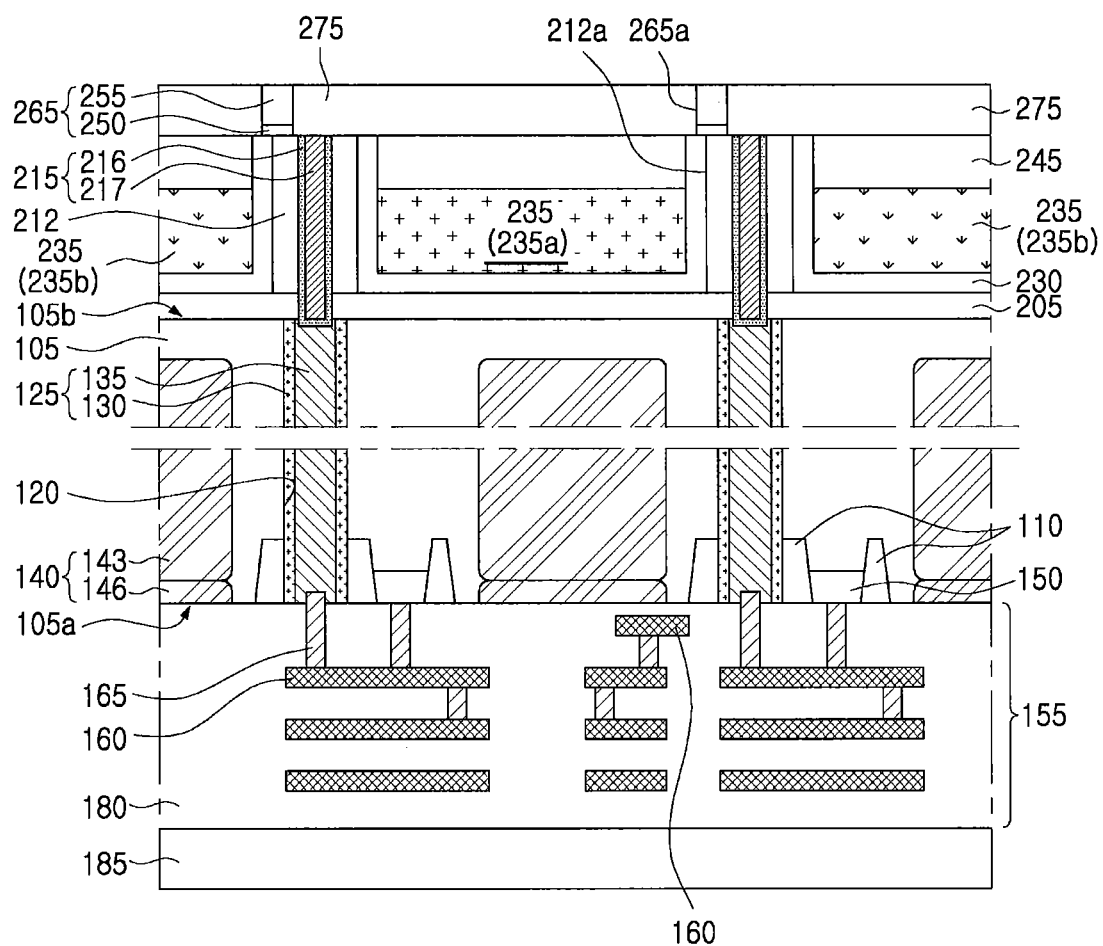

Referring to FIGS. 3 and 17H, first electrodes 275 may be formed in the second openings 265a of the separation structure 265. The forming of the first electrodes 275 may include forming a transparent electrode material layer on the semiconductor substrate 105 having the separation structure 265, and planarizing the transparent electrode material layer until an upper surface of the separation structure 265 is exposed. The planarization process may be a chemical mechanical polishing (CMP) process.

Referring again to FIGS. 3 and 4, a photoelectric layer 280, a second electrode 285, and a cover insulating layer 290 may be formed on the first electrodes 275 and the separation structure 265 to be stacked sequentially thereon. Microlenses 295 may be formed on the cover insulating layer 290. Thus, the image sensor described above with reference to FIGS. 3 and 4 may be fabricated.

An example of a method of forming a structure of the image sensor described above with reference to FIG. 6A will be described with reference to FIGS. 18A and 18B.

Figure 18A:
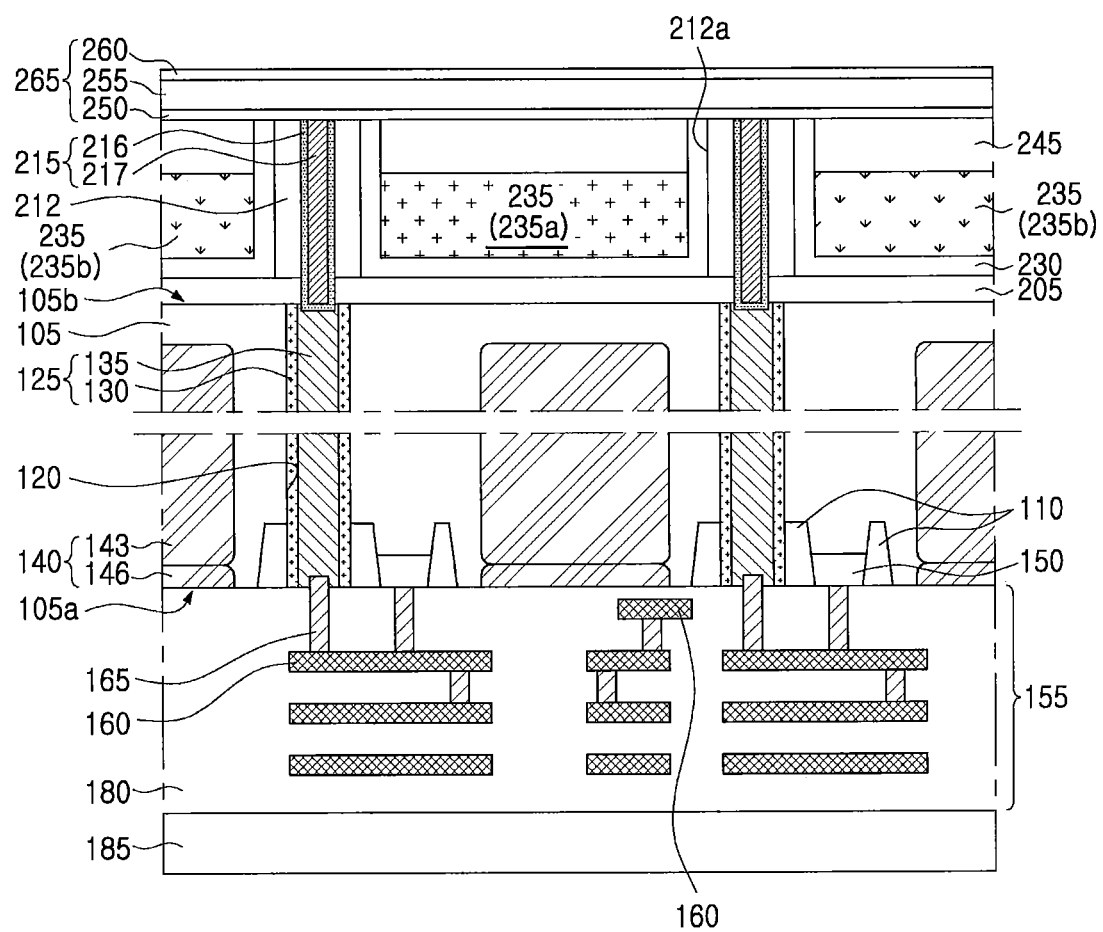
FIGS. 18A and 18B are cross-sectional views illustrating a method of forming an image sensor according to an example embodiment.

Referring to FIGS. 3 and 18A, the same semiconductor substrate 105 as that described above with reference to FIGS. 17A through 17E may be provided. For example, the same semiconductor substrate 105 as that described above with reference to FIG. 17E may be provided, and may have the insulating pattern 212 and the contact plugs 215 exposed and the capping insulating layers 245 formed thereon.

A first insulating layer 250, a second insulating layer 255, and a third insulating layer 260 may be formed on the capping insulating layers 245 and the insulating pattern 212 to be stacked sequentially thereon. The first and second insulating layers 250 and 255 may be the same as those described above with reference to FIG. 17F. The third insulating layer 260 may be formed of a material having etch selectivity with respect to the second insulating layer 255, for example, a silicon nitride.

Figure 18B:
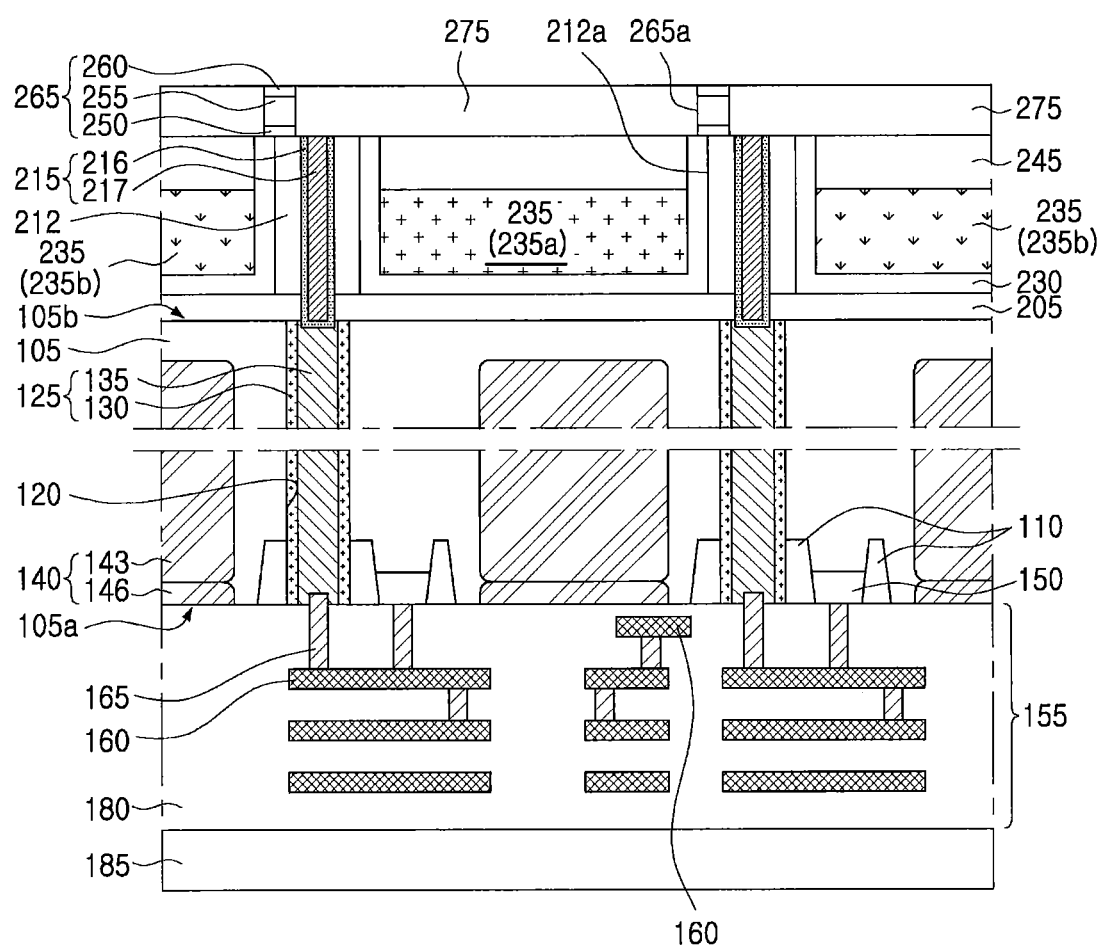

Referring to FIGS. 3 and 18B, the first to third insulating layers 250, 255, and 260 may be patterned to form a separation structure 265 having second openings 265a. The forming of the separation structure 265 having the second openings 265a by patterning the first to third insulating layers 250, 255, and 260 may include exposing the first insulating layer 250 by patterning the second and third insulating layers 255 and 260, and selectively etching the exposed first insulating layer 250. Thus, as described above with reference to FIG. 17G, since the capping insulating layers 245 may be prevented from being damaged by etching while forming the separation structure 265, a reduction or deterioration in resolution of the image sensor that may occur due to etching damage to the capping insulating layers 245 may be avoided.

A transparent electrode material layer may be formed on the semiconductor substrate 105 having the separation structure 265, and may be planarized until the separation structure 265 is exposed to form first electrodes 275 defined in the second openings 265a of the separation structure 265.

The planarizing of the transparent electrode material layer may include performing a planarization process using the third insulating layer 260 of the separation structure 265 as a planarization stop layer. The planarization process may be a CMP process. Using the third insulating layer 260 as a planarization stop layer may prevent a thickness of the second insulating layer 255 from being reduced. Thus, the first electrodes 275 may have a uniform thickness. As a result, distribution characteristics of the image sensor may be increased.

An example of a method of forming a structure of the image sensor described above with reference to FIG. 7A will be described with reference to FIGS. 19A through 19F.

Figure 19A:
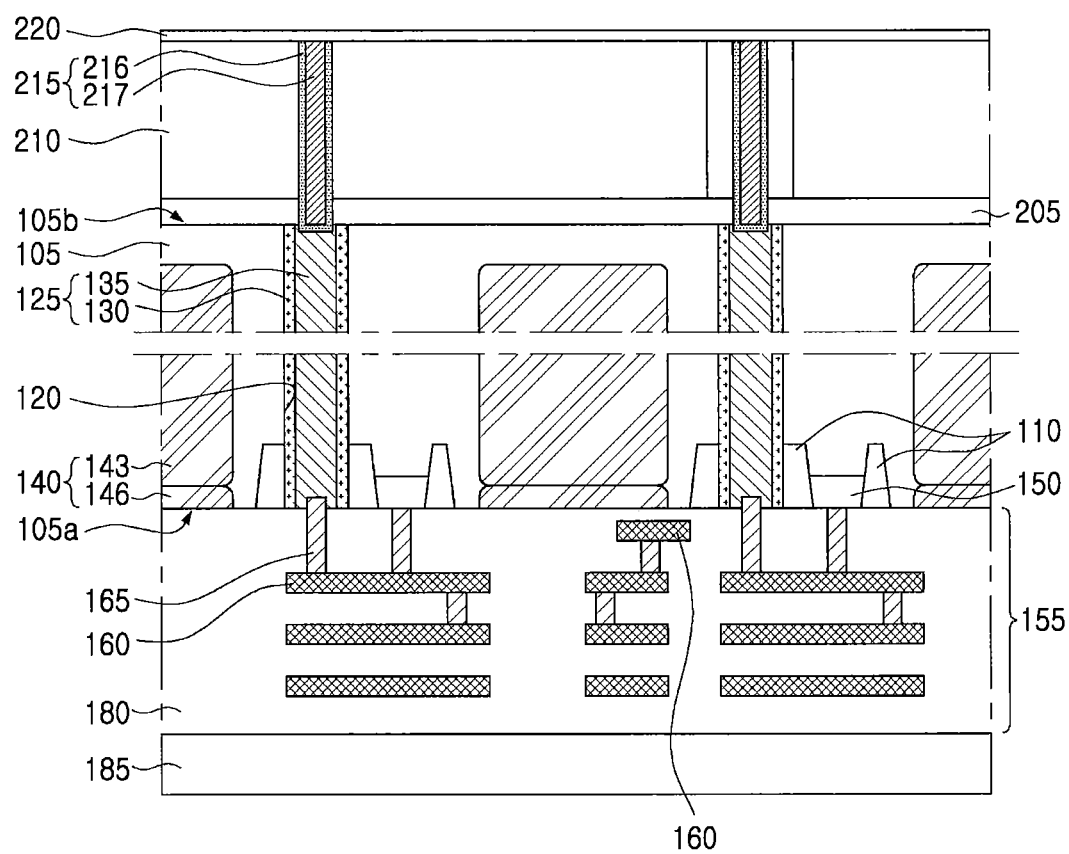
FIGS. 19A through 19F are cross-sectional views illustrating a method of forming an image sensor according to an example embodiment.

Referring to FIGS. 3 and 19A, the same semiconductor substrate 105 as that described above with reference to FIGS. 17A and 17B may be provided. For example, a base insulating layer 220 may be formed on the same semiconductor substrate 105 as that described above with reference to FIG. 17B, and the semiconductor substrate 105 may have the insulating pattern 212 and the contact plugs 215 exposed and the capping insulating layers 245 formed thereon.

Figure 19B:
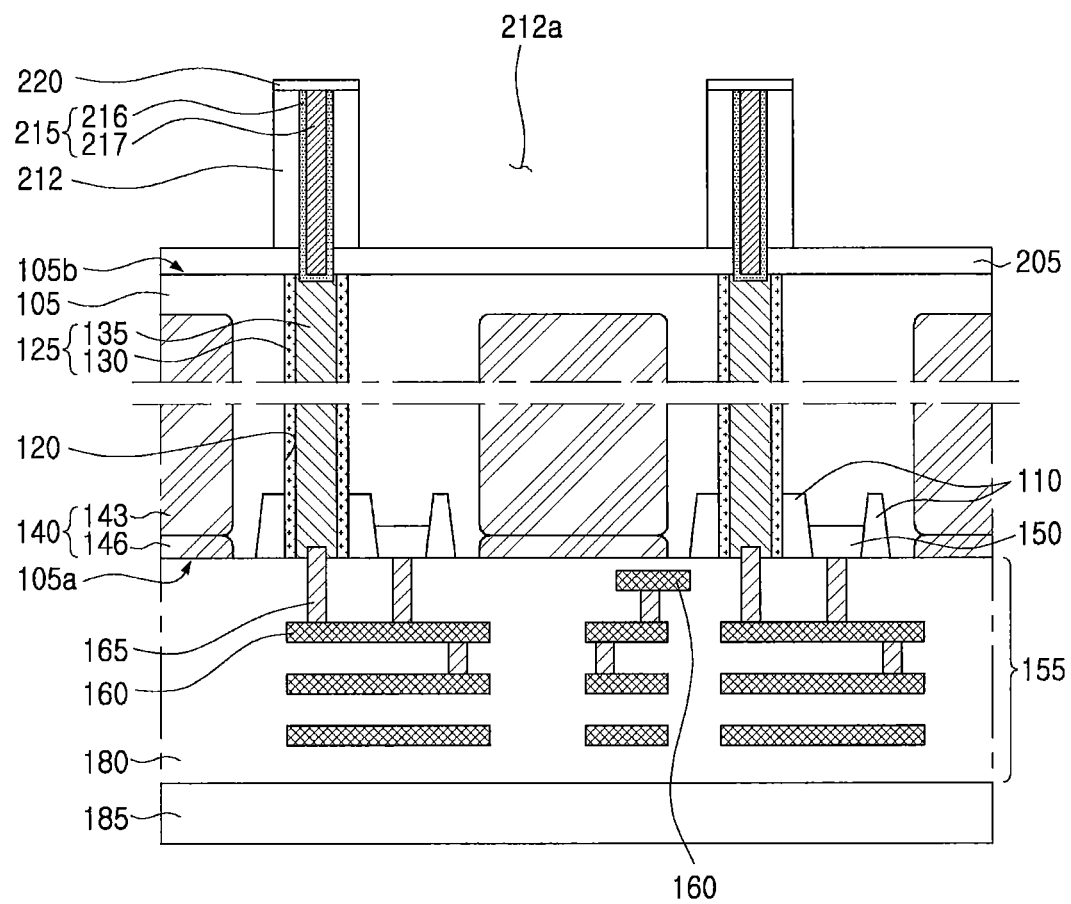

Referring to FIGS. 3 and 19B, the insulating layer 210 and the base insulating layer 220 may be patterned. Thus, the insulating layer 210 may be patterned to be formed as an insulating pattern 212 having first openings 212a, and the base insulating layer 220 may remain on the insulating pattern 212. The base insulating layer 220 remaining on the insulating pattern 212 may cover the contact plugs 215.

Figure 19C:
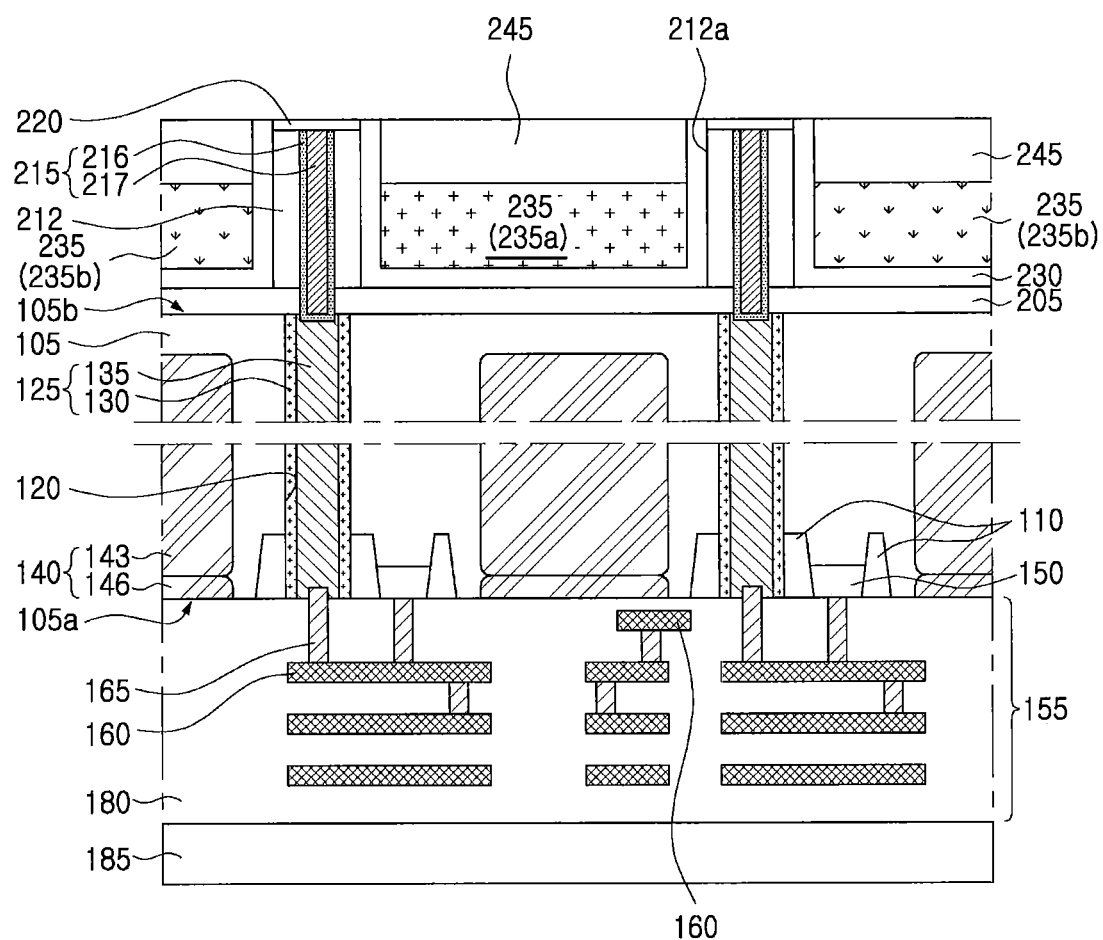

Referring to FIGS. 3 and 19C, an insulating liner 230 may be conformally formed on the second surface 105b of the semiconductor substrate 105 having the insulating pattern 212 and the base insulating layer 220, color filters 235 may be formed on the insulating liner 230 to fill portions of the first openings 212a of the insulating pattern 212, a capping insulating layer 245 may be formed to cover the color filters 235 and the insulating liner 230, and a planarization process using the base insulating layer 220 as a planarization stop layer may be performed to planarize the capping insulating layer 245 and the insulating liner 230. The planarization process may be a CMP process. The capping insulating layer 245 may be planarized to be formed as a plurality of capping insulating layers 245 spaced apart from one another, and the insulating liner 230 may be planarized to be formed as a plurality of insulating liners 230 spaced apart from one another. The capping insulating layers 245 and the insulating liners 230 may have upper surfaces coplanar with the base insulating layer 220.

Using the base insulating layer 220 as a planarization stop layer may significantly reduce a dishing effect of the capping insulating layers 245 that may occur during the planarization process. Since the planarization process may prevent the upper surfaces of the capping insulating layers 245 from being recessed, the capping insulating layers 245 may stably protect the color filters 235. Thus, a deterioration in performance or productivity of the image sensor, due to damage to or deformation of the capping insulating layers 245 that may occur by the planarization process, may be prevented.

Figure 19D:
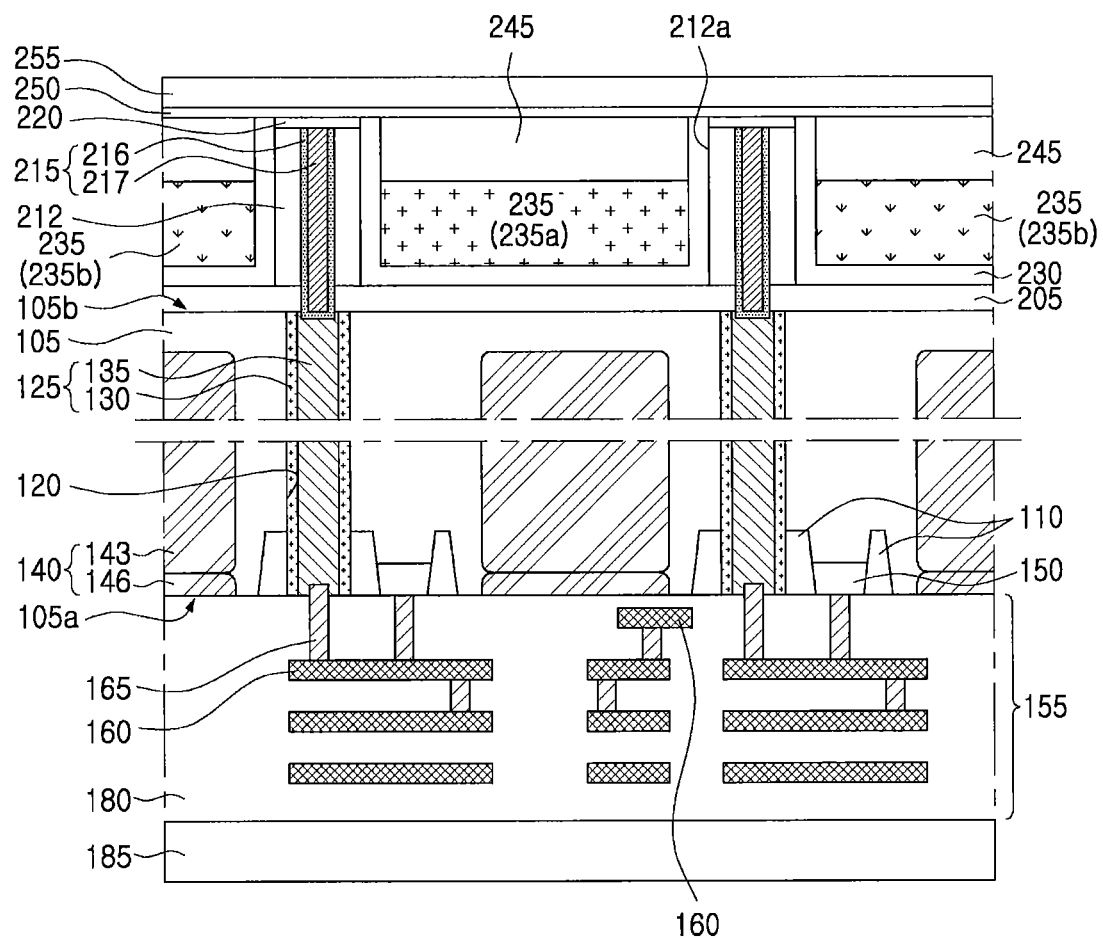

Referring to FIGS. 3 and 19D, a first insulating layer 250 and a second insulating layer 255 may be formed sequentially to cover the base insulating layer 220, the insulating liners 230, and the capping insulating layers 245. The base insulating layer 220 and the first insulating layer 250 may be formed of the same material. The base insulating layer 220 and the first insulating layer 250 may also be formed of materials having etch selectivity with respect to the second insulating layer 255 and the capping insulating layers 245.

Figure 19E:
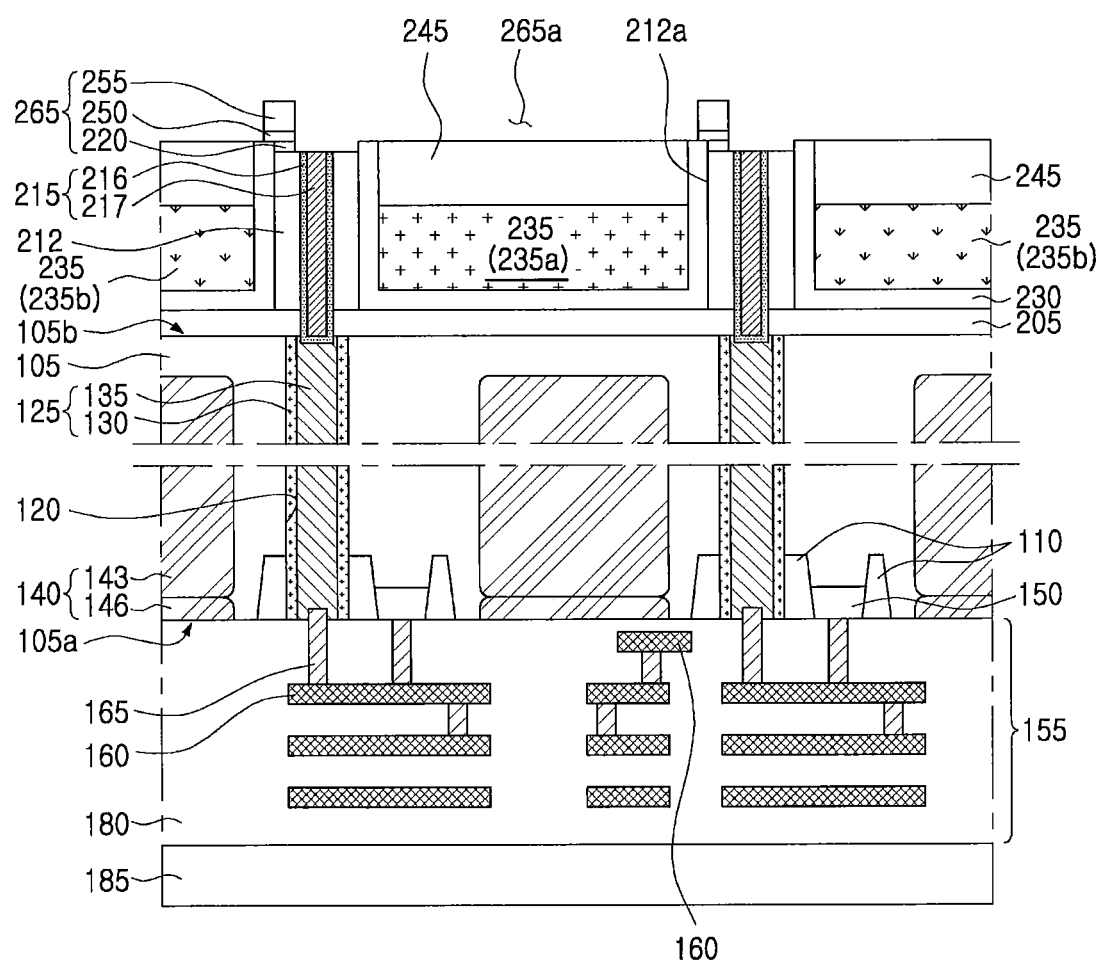

Referring to FIGS. 3 and 19E, the second insulating layer 255 may be patterned to expose the first insulating layer 250, and the first insulating layer 250 and the base insulating layer 220 may be etched selectively to form a separation structure 265 having second openings 265a exposing the capping insulating layers 245 and the contact plugs 215. Thus, as described above with reference to FIG. 17G, since the capping insulating layers 245 may be prevented from being damaged by etching while forming the separation structure 265, a reduction or deterioration in resolution of the image sensor that may occur due to etching damage to the capping insulating layers 245 may be avoided.

Figure 19F:
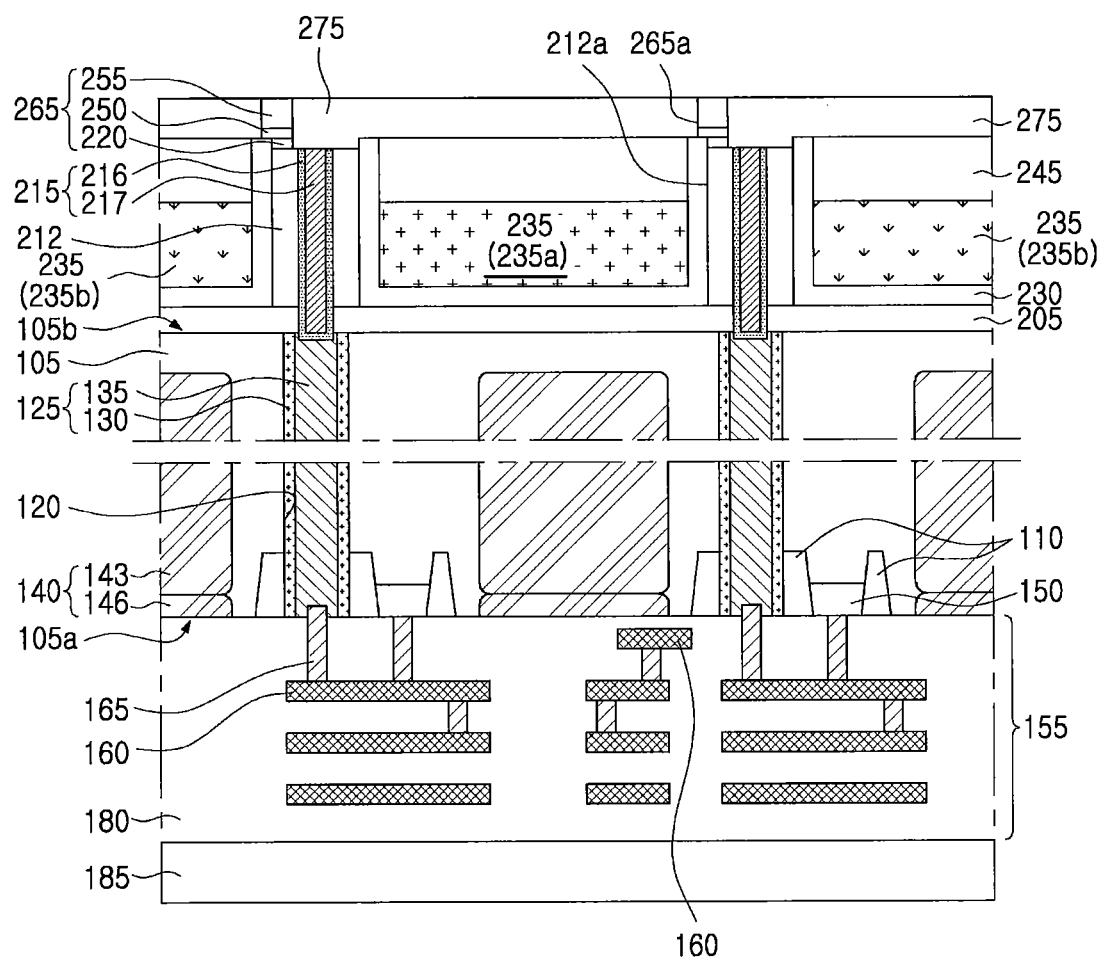

Referring to FIGS. 3 and 19F, first electrodes 275 may be formed to fill the second openings 265a.

In another example embodiment, a third insulating layer 260 may be further formed on the second insulating layer 255 described above with reference to FIG. 19D, in order to form the same separation structure 265 as that described above with reference to FIG. 8. The third insulating layer 260 as described above with reference to FIG. 18B may cause the first electrodes 275 to have a uniform thickness. Thus, distribution characteristics of the image sensor may be increased.

In another example embodiment, in order to form the same first electrodes 275 as those described above with reference to FIG. 9, the first insulating layer 250 and the base insulating layer 220 may be formed and then portions of the capping insulating layers 245 and the insulating liners 230 may be etched, or portions of the capping insulating layers 245 and the insulating liners 230 may be etched simultaneously while etching the first insulating layer 250 and the base insulating layer 220, as described above with reference to FIG. 19E.

An example of a method of forming a structure of the image sensor described above with reference to FIG. 10 will be described with reference to FIGS. 20A and 20B.

Figure 20A:
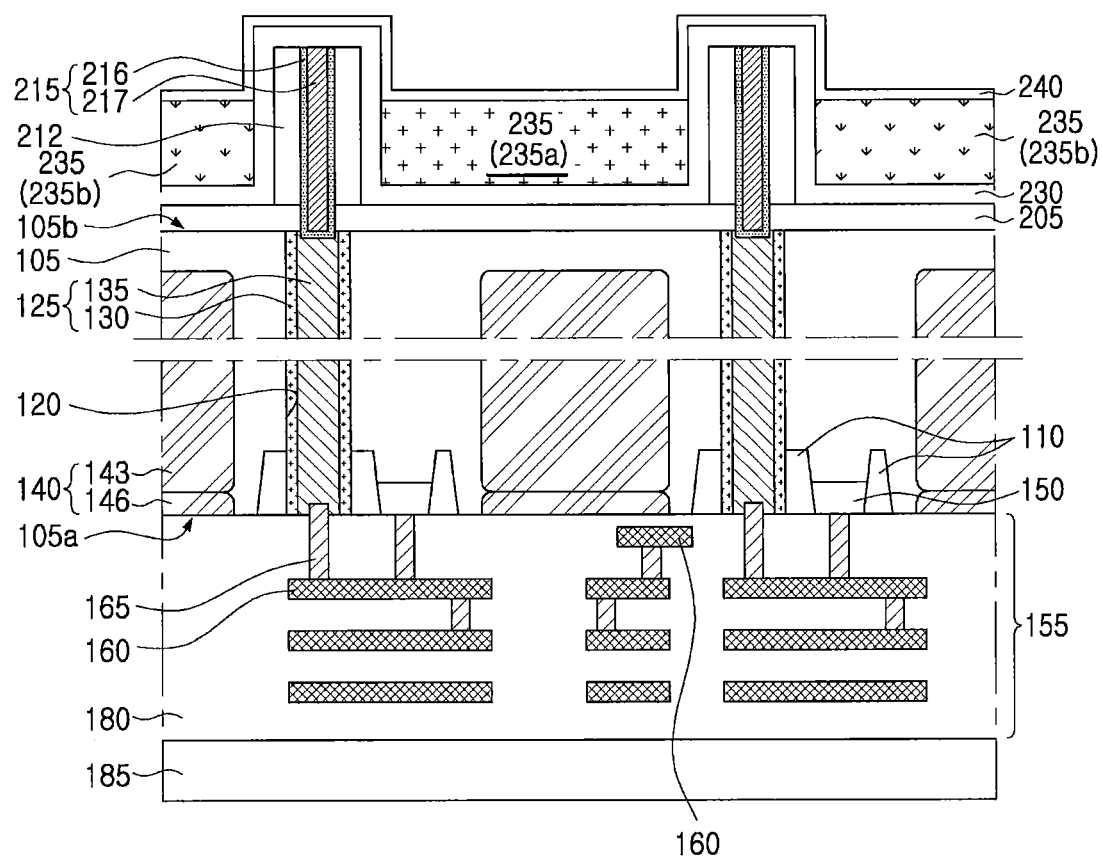
FIGS. 20A and 20B are cross-sectional views illustrating a method of forming an image sensor according to an example embodiment.

Referring to FIGS. 3 and 20A, the same semiconductor substrate 105 as that described above with reference to FIGS. 17A through 17D may be provided, and may have the color filters 235 formed thereon. A filter protection layer 240 may be conformally formed on the semiconductor substrate 105 having the color filters 235 formed thereon. The filter protection layer 240 may protect the color filters 235.

Figure 20B:
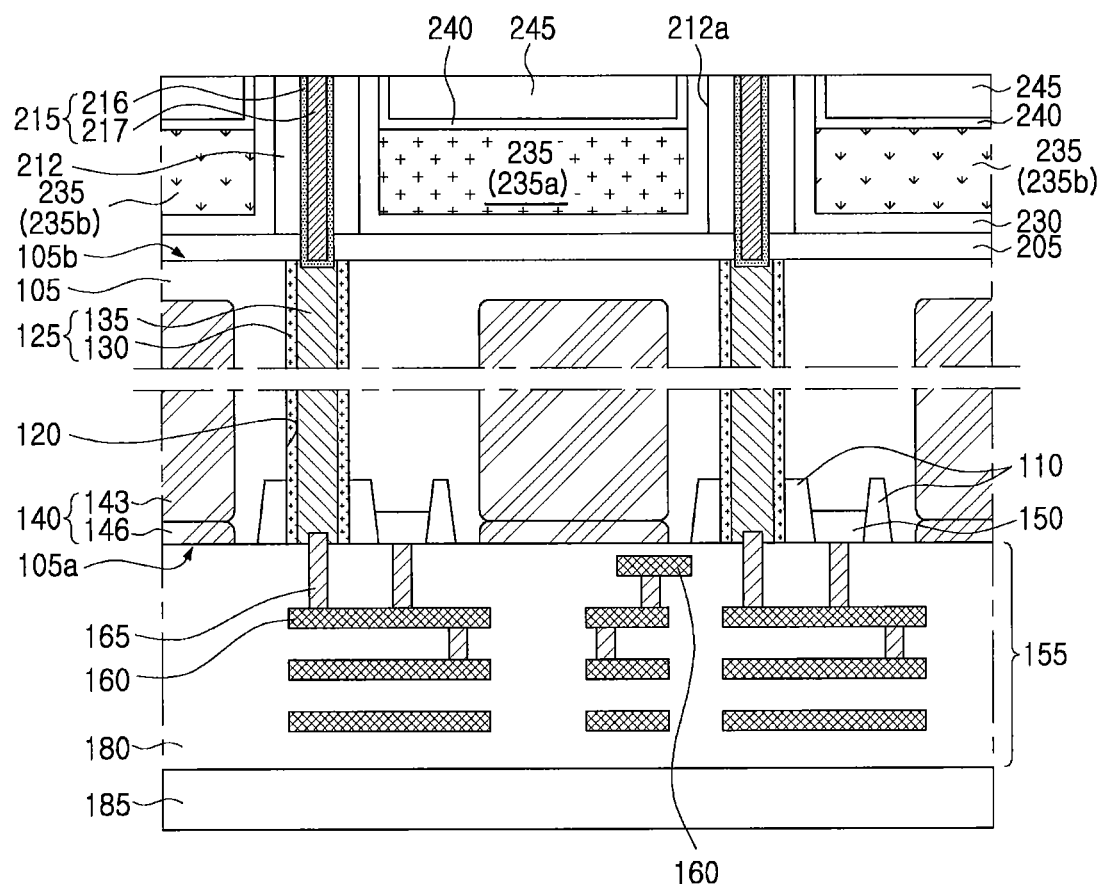

Referring to FIGS. 3 and 20B, a capping insulating layer 245 may be formed on the filter protection layer 240, and the filter protection layer 240 and the capping insulating layer 245 may be planarized. Thus, an image sensor including the same filter protection layer 240 as that described above with reference to FIG. 11 may be fabricated.

In another example embodiment, in order to form the same filter protection layer 240 as that described above with reference to FIG. 14, a process of etching a portion of the insulating liner 230 and forming the filter protection layer 240 may be performed prior to forming the filter protection layer 240 of FIG. 20A.

An example of a method of forming a structure of the image sensor described above with reference to FIG. 15 will be described with reference to FIGS. 21A through 21E.

Figure 21A:
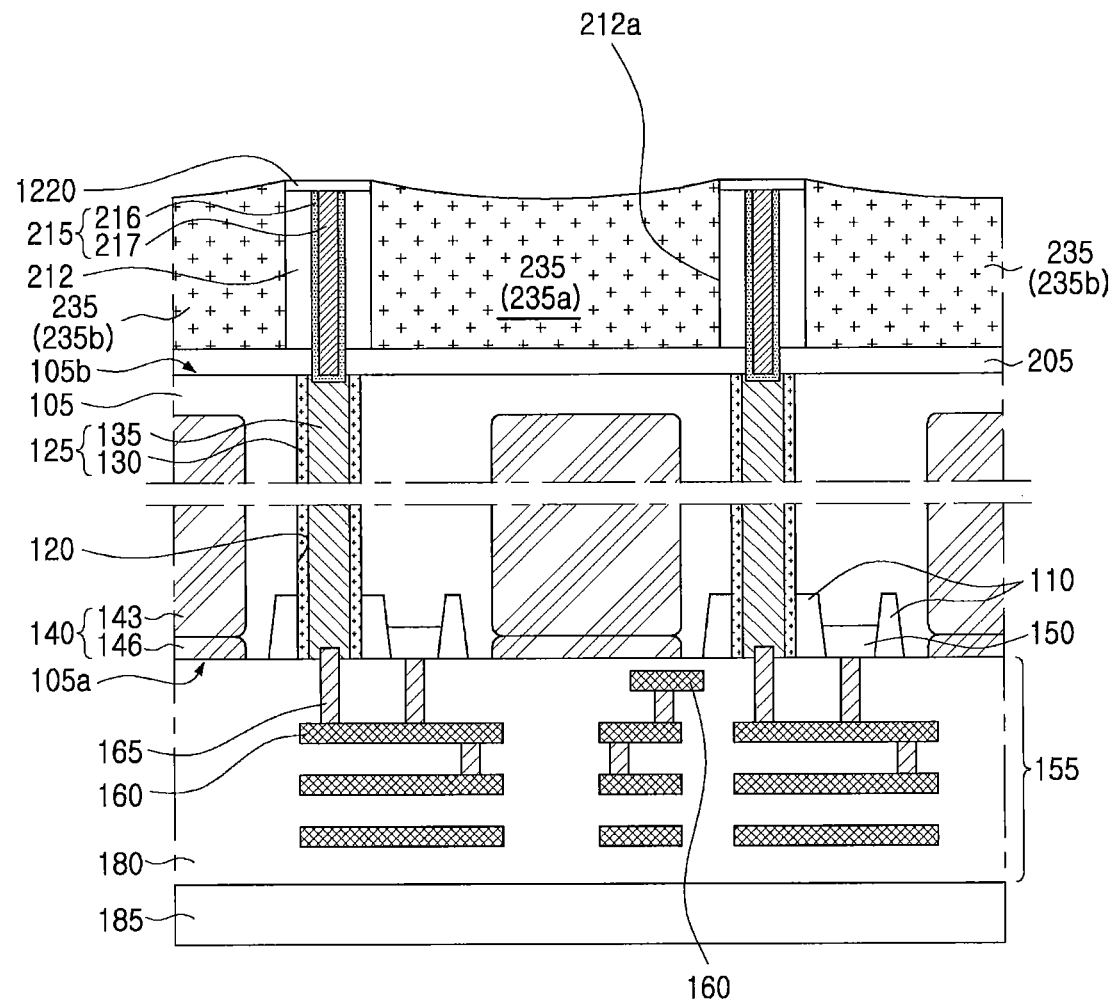
FIGS. 21A through 21E are cross-sectional views illustrating a method of forming an image sensor according to an example embodiment.

Referring to FIGS. 3 and 21A, the same semiconductor substrate 105 as that described above with reference to FIGS. 19A and 19B may be provided, and may have the insulating pattern 212 having the first openings 212a, and the base insulating layer 220 of FIG. 19B formed on the insulating pattern 212. Here, the base insulating layer 220 of FIG. 19B may be referred to as a contact protection layer 1220 of FIG. 21A. Thus, the base insulating layer 220 of FIG. 19B described above with reference to FIG. 19B and the contact protection layer 1220 of FIG. 21A described above with reference to FIG. 21A may be understood as the same component formed of the same material and to have the same thickness.

The first openings 212a of the insulating pattern 212 may be filled with color filters 235. The contact protection layer 1220 may prevent the contact plugs 215 from being corroded by a process of forming the color filters 235 by covering the contact plugs 215 formed in the insulating pattern 212.

Figure 21B:
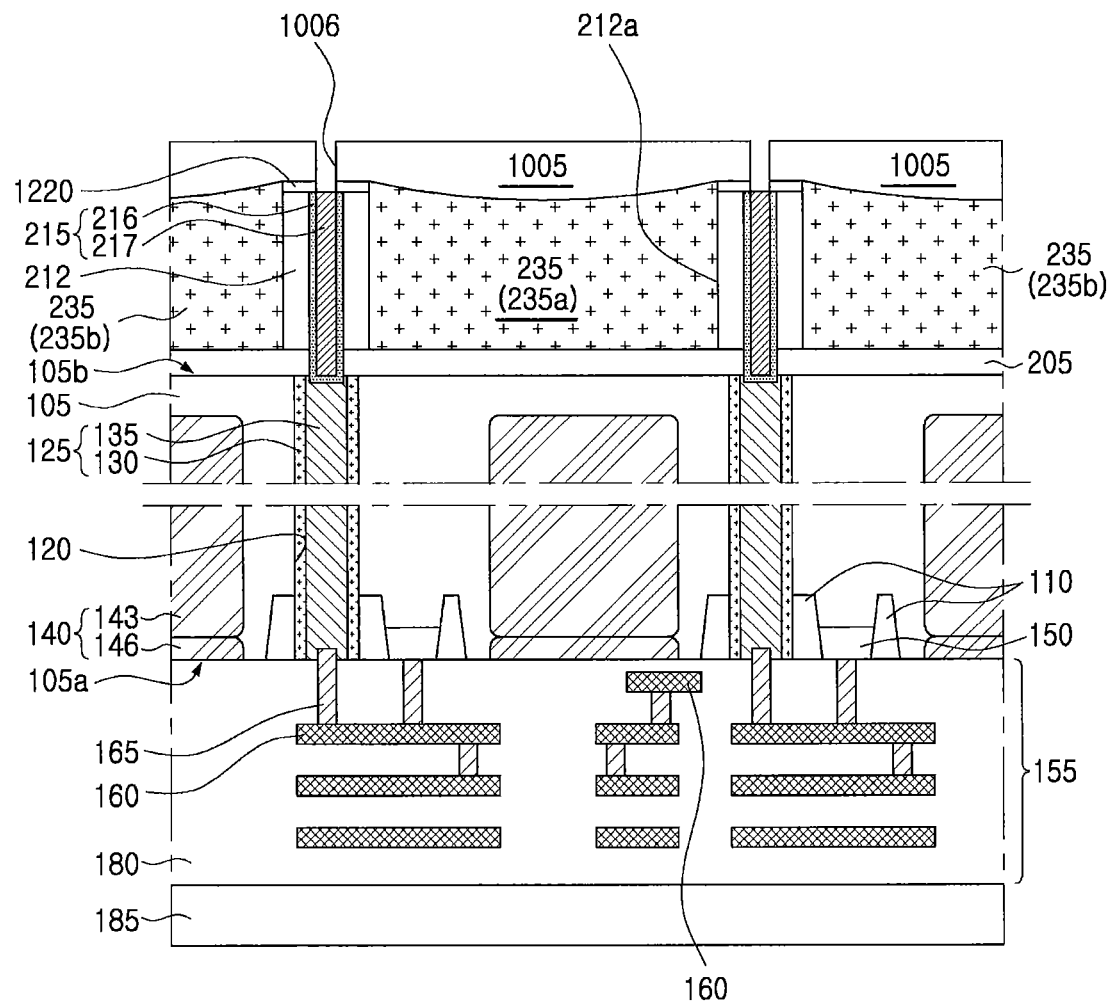

Referring to FIGS. 3 and 21B, an insulating material may be formed on the contact protection layer 1220 and the color filters 235, and the insulating material may be planarized to form a capping insulating layer 1005 having a flat upper surface. The capping insulating layer 1005 may be formed of a silicon oxide.

Holes 1006 may be formed through the capping insulating layer 1005 and the contact protection layer 1220, and may expose the contact plugs 215.

Figure 21C:
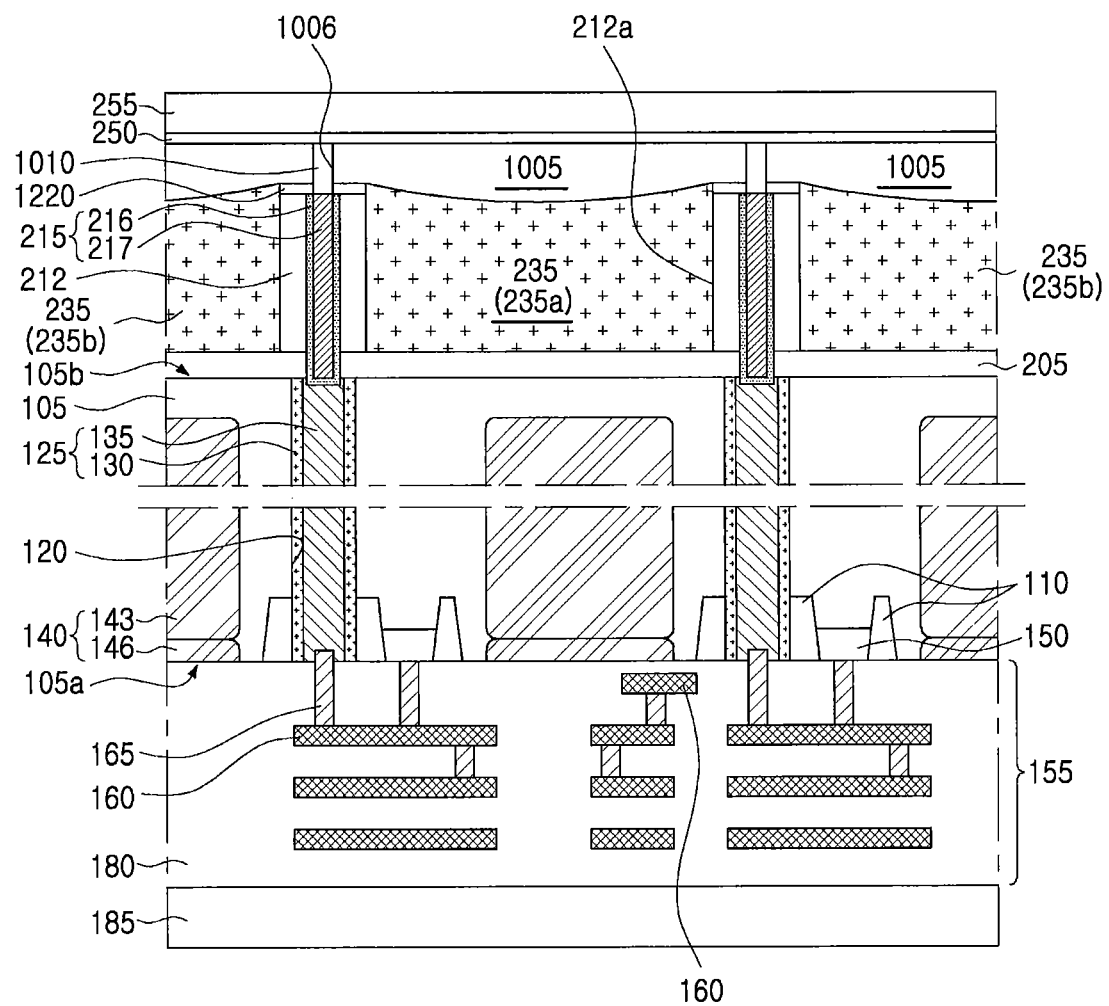

Referring to FIGS. 3 and 21C, conductive vias 1010 may be formed to fill the holes 1006. In an example embodiment, the conductive vias 1010 may be formed of a metal nitride, such as TiN or TaN. Alternatively, the conductive vias 1010 may also be formed of a transparent electrode material.

First and second insulating layers 250 and 255 may be formed sequentially on the capping insulating layer 245 to cover the conductive vias 1010 and to have etch selectivity with respect to each other. The first insulating layer 250 may have a thickness less than that of the second insulating layer 255. The first insulating layer 250 may be formed of a material having high etch selectivity with respect to the capping insulating layer 1005. For example, the first insulating layer 250 may be formed of a silicon nitride, and the second insulating layer 255 and the capping insulating layer 1005 may be formed of silicon oxides.

Figure 21D:
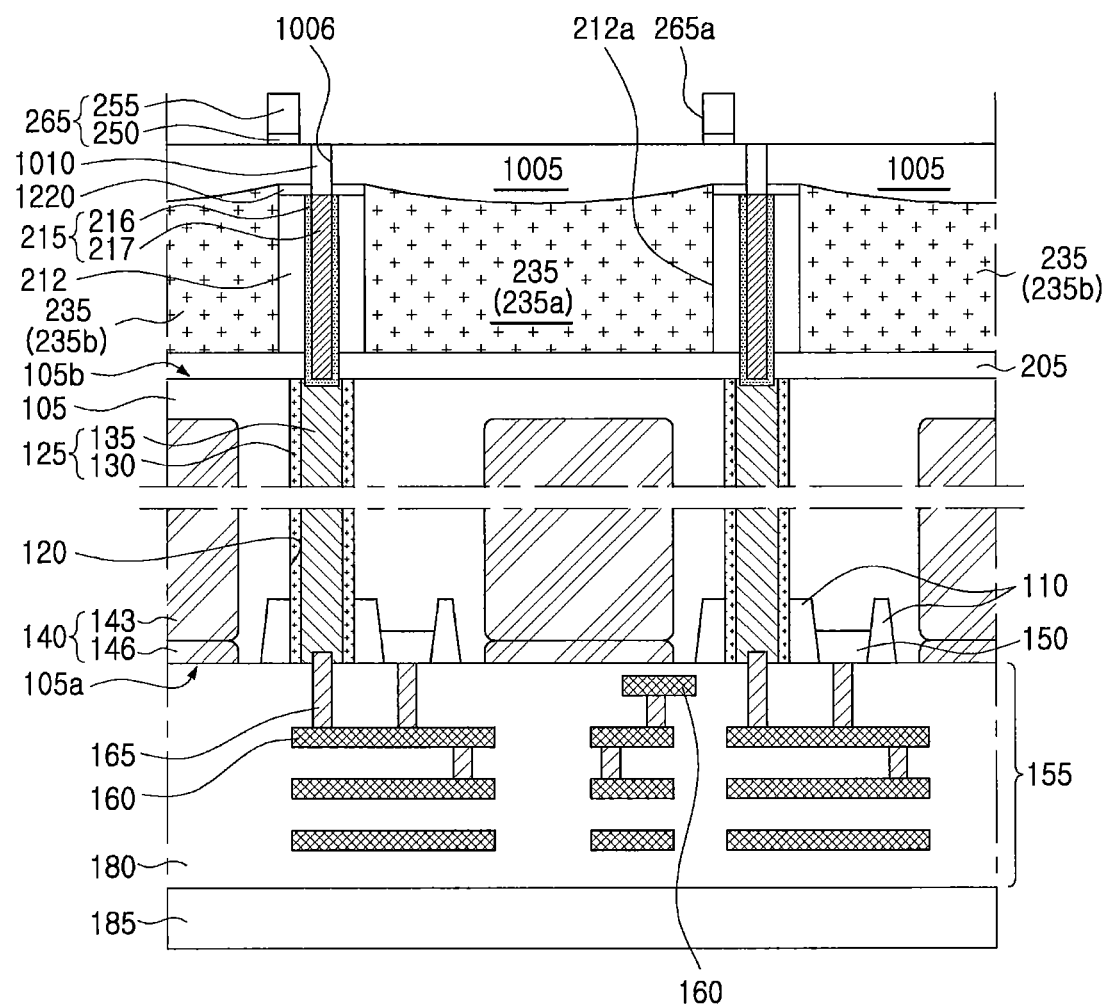

Referring to FIGS. 3 and 21D, the first and second insulating layers 250 and 255 may be patterned to form a separation structure 265 having second openings 265a. Each of the second openings 265a may expose one of the conductive vias 1010 and may overlap one of the color filters 235.

The forming of the separation structure 265 may include exposing the first insulating layer 250 by patterning the second insulating layer 255, and forming the second openings 265a while significantly reducing etching damage to the capping insulating layer 1005 by selectively etching the first insulating layer 250 formed to have a thickness less than that of the second insulating layer 255 while having high etch selectivity with respect to the capping insulating layer 1005.

Figure 21E:
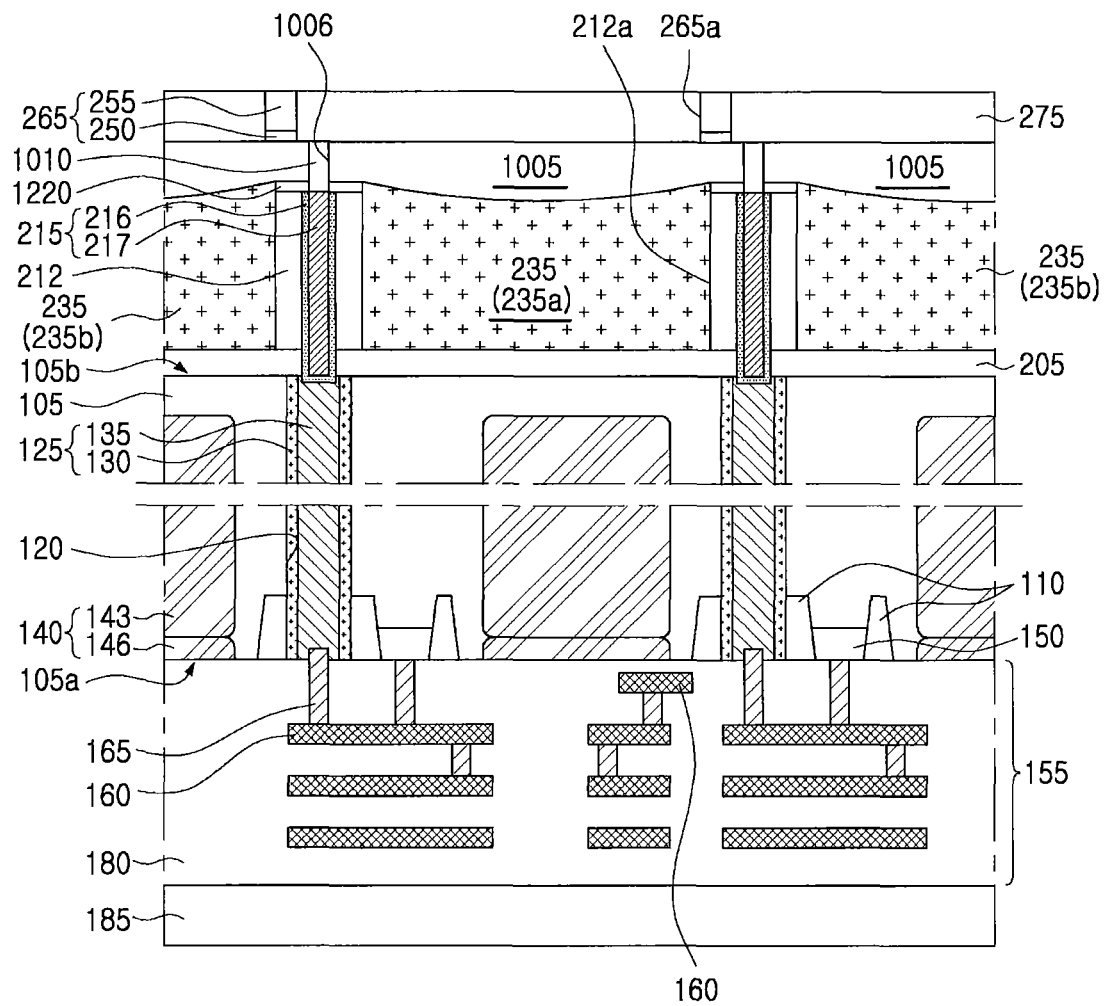

Referring to FIGS. 3 and 21E, the same process as that described above with reference to FIG. 17H may be performed to form first electrodes 275 filling the second openings 265a. Subsequently, a photoelectric layer 280, a second electrode 285, and a cover insulating layer 290 may be formed on the first electrodes 275 and the separation structure 265 to be stacked sequentially thereon. Microlenses 295 may be formed on the cover insulating layer 290. Thus, the image sensor described above with reference to FIG. 15 may be fabricated.

An example of a method of forming a structure of the image sensor described above with reference to FIG. 16 will be described with reference to FIGS. 22A through 22C.

Figure 22A:
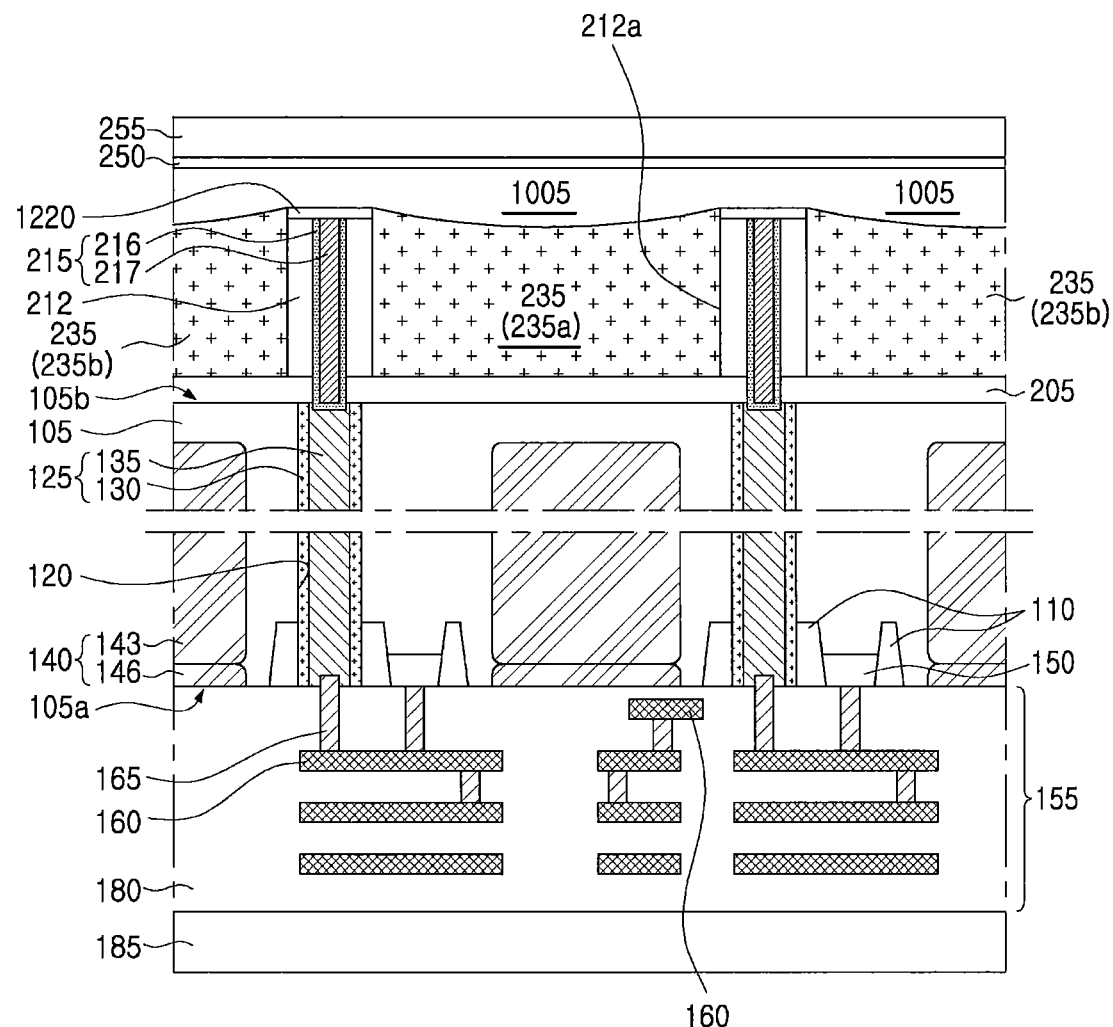
FIGS. 22A through 22C are cross-sectional views illustrating a method of forming an image sensor according to an example embodiment.

Referring to FIGS. 3 and 22A, the same semiconductor substrate 105 as that described above with reference to FIG. 21A may be provided, and may have the color filters 235 formed thereon. A capping insulating layer 1005, a first insulating layer 250, and a second insulating layer 255 may be formed sequentially to cover the color filters 235 and the contact protection layer 1220. The capping insulating layer 1005, the first insulating layer 250, and the second insulating layer 255 may be formed of the same material and to have the same thickness as those described above with reference to FIGS. 21B and 21C.

Figure 22B:
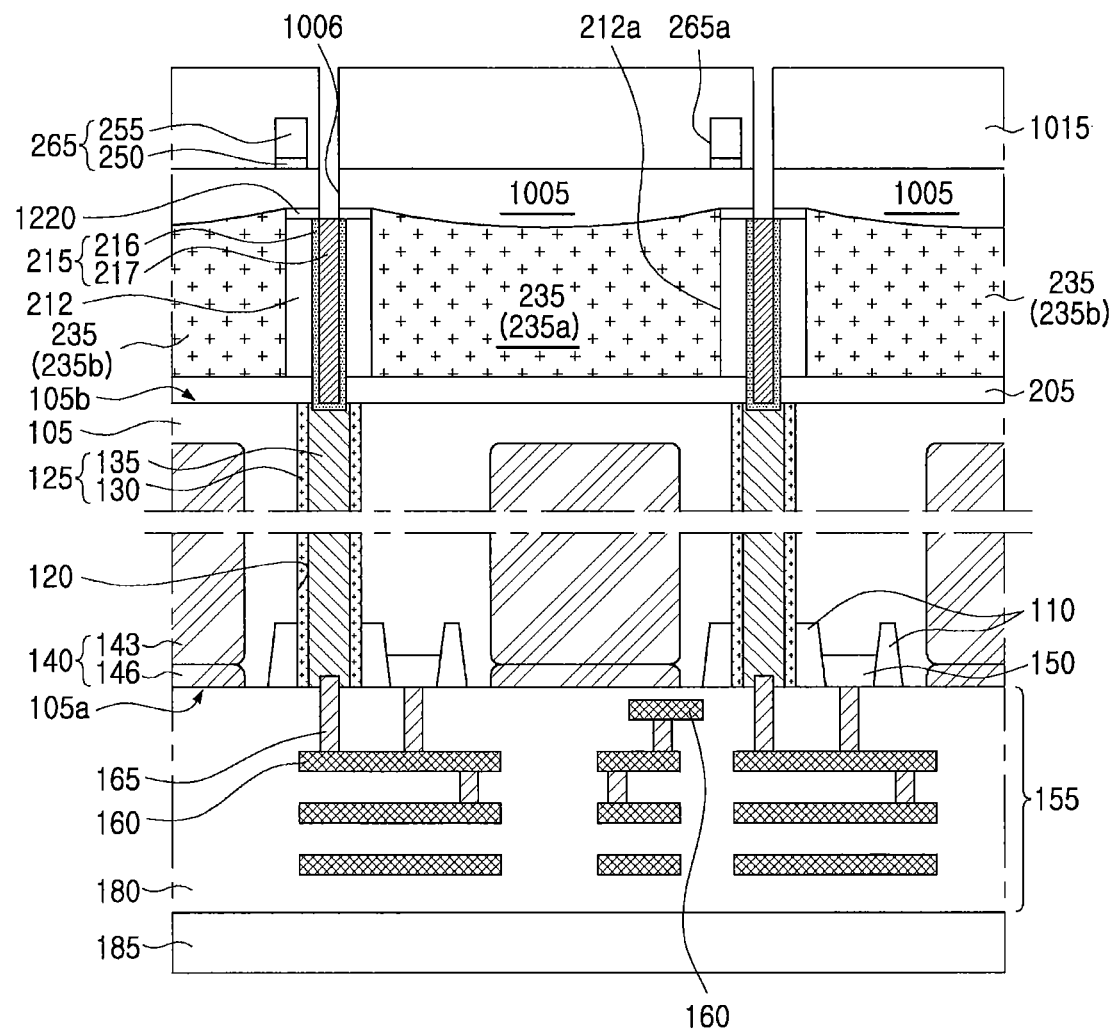

Referring to FIGS. 3 and 22B, the first and second insulating layers 250 and 255 may be patterned to form the same separation structure 265 as that described above with reference to FIG. 21D. The separation structure 265 may have second openings 265a overlapping the contact plugs 215 and the color filters 235.

A mask 1015 may be formed on the capping insulating layer 1005 to cover the separation structure 265. The mask 1015 may have an opening exposing a portion of the capping insulating layer 1005. An etching process using the mask 1015 as an etching mask may be performed to form holes 1006 passing through the capping insulating layer 1005 and the contact protection layer 1220 and exposing the contact plugs 215.

Figure 22C:
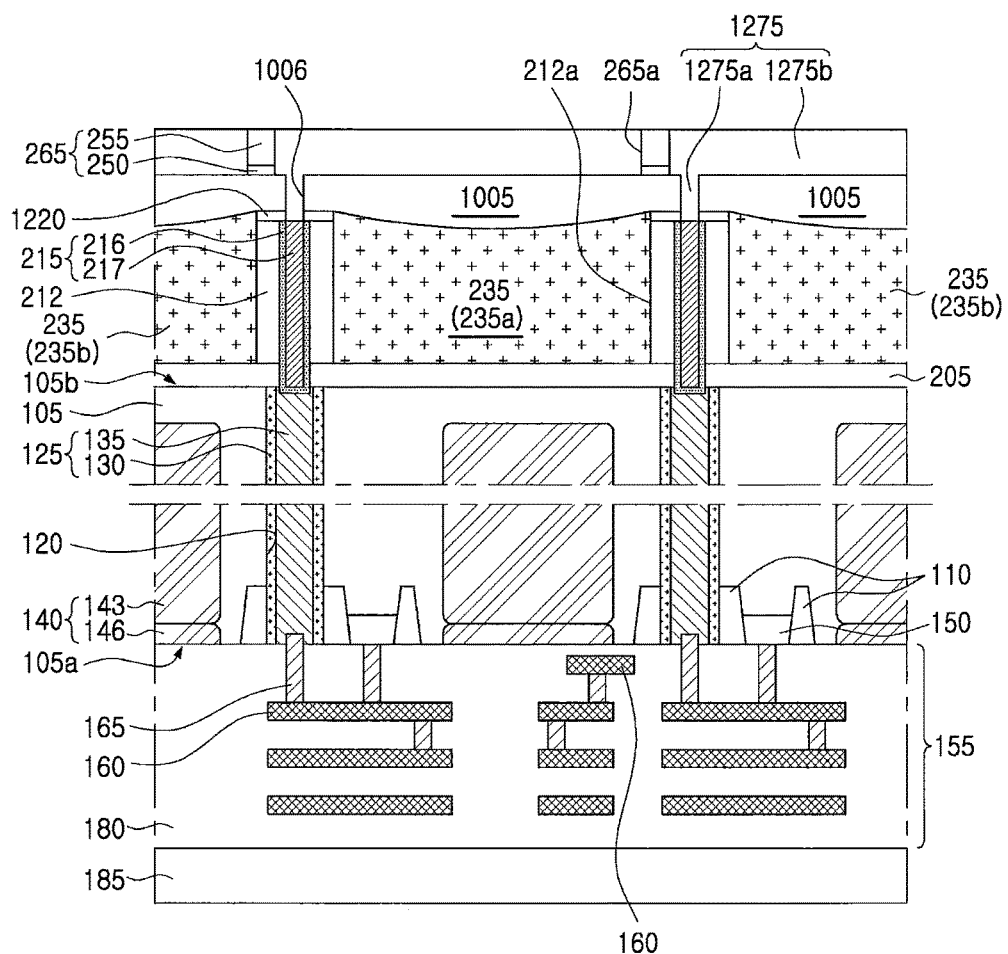

Referring to FIGS. 3 and 22C, the mask 1015 of FIG. 22B may be selectively removed. Subsequently, a transparent electrode material may be formed on the second surface 105b of the semiconductor substrate 105 having the holes 1006 and the second openings 265a, and the transparent electrode material may be planarized until an upper surface of the separation structure 265 is exposed to form first electrodes 1275 filling the holes 1006 and the second openings 265a. The planarization process may be a CMP process. The first electrodes 1275 may include conductive via portions 1275a formed in the holes 1006, and electrode portions 1275b formed in the second openings 265a.

The methods of forming various examples of the image sensor, according to an example embodiment, may be performed using the planarization process and the etching process. Example embodiments may provide the method of forming the image sensor and/or the structure of the image sensor, which may prevent the capping insulating layers 245 or 1005 protecting the color filters 235 from being damaged by the planarization process and/or the etching process during the planarization process and/or the etching process. For example, as previously described, the image sensor, according to example embodiments, may include the first electrodes 275 and 1275 respectively formed on the capping insulating layers 245 and 1005, and the separation structure 265 surrounding the first electrodes 275 or 1275. The separation structure 265 may include at least two first and second insulating layers 250 and 255 having different etch selectivity, and the first insulating layer 250 disposed below the second insulating layer 255 may be formed of a material having etch selectivity with respect to the capping insulating layers 245 or 1005. The structure of the separation structure 265 including the first and second insulating layers 250 and 255 described above may prevent the capping insulating layers 245 and 1005 from being damaged during the process of forming the first electrodes 275 and 1275, respectively, as mentioned above in detail.

Thus, a reduction or deterioration in the resolution of the image sensor that may occur due to damage to the capping insulating layers 245 or 1005 protecting the color filters 235 may be prevented. As a result, defects may be reduced, thereby increasing productivity of the image sensor. Further, the image sensor may have high resolution.

Further, according to example embodiments, the first electrodes 275 or 1275 may be formed to have a substantially uniform thickness. Thus, distribution characteristics of the image sensor may be increased. As a result, according to example embodiments, the image sensor including a stable and reliable color filter and electrode may be provided.

As set forth above, according to example embodiments of the present inventive concept, an image sensor including a stable and reliable color filter and electrode may be provided. Further, the image sensor may be miniaturized by forming a photoelectric layer that may cause photoelectric change at a wavelength of green light on a red and/or blue filter layer.

While exemplary embodiments have been shown and described above, it will be apparent to those skilled in the art that modifications and variations could be made without departing from the scope of the present inventive concept, as defined by the appended claims.

What is claimed is:

1. An image sensor, comprising:
   an insulating pattern disposed on a semiconductor substrate and having an opening;
   a through hole passing through the semiconductor substrate;
   a through electrode disposed in the through hole;
   a color filter disposed in the opening of the insulating pattern;
   an antireflective layer disposed between the insulating pattern and the semiconductor substrate and between the color filter and the semiconductor substrate;
   a capping insulating layer disposed on the color filter;
   a contact plug passing through the insulating pattern and the antireflective layer and electrically connected to the through electrode;
   a first electrode disposed on the capping insulating layer and having a portion thereof overlapping the color filter;
   a separation structure surrounding a side surface of the first electrode; and
   a photoelectric layer disposed on the first electrode,
   wherein the separation structure includes a first insulating layer and a second insulating layer formed of different materials, and wherein the first insulating layer and the second insulating layer are on the side surface of the first electrode.

2. The image sensor of claim 1, further comprising:
   a second electrode disposed on the photoelectric layer,
   wherein the photoelectric layer and the second electrode overlap the first electrode and
   the separation structure, the first electrode and the second electrode are transparent electrodes, and the photoelectric layer is an organic photoelectric layer.

3. The image sensor of claim 1, further comprising:
   an insulating liner interposed between the antireflective layer and the color filter and extending between the insulating pattern and the color filter and between the insulating pattern and the capping insulating layer,
   wherein the insulating liner is formed of a material different from a material of the first insulating layer.

4. The image sensor of claim 1, wherein the separation structure further includes a third insulating layer disposed on the second insulating layer, and the third insulating layer is formed of a material different from a material of the second insulating layer.

5. The image sensor of claim 1, wherein the separation structure further includes a base insulating layer disposed below the first insulating layer, the first insulating layer and the second insulating layer have the same width as each other, and the base insulating layer has a width less than a width of the first insulating layer.

6. The image sensor of claim 1, wherein the capping insulating layer has an upper surface coplanar with an upper surface of the insulating pattern.

7. The image sensor of claim 1, further comprising:
a filter protection layer interposed between the color filter and the capping insulating layer and extending on a side surface of the capping insulating layer,
wherein the filter protection layer is formed of a material different from a material of the capping insulating layer.

8. The image sensor of claim 1, wherein the first electrode is electrically connected to an upper surface of the contact plug, while contacting an upper surface of the contact plug.

9. The image sensor of claim 1, further comprising: a conductive via disposed between the first electrode and the contact plug,
wherein the conductive via electrically connects the first electrode to the contact plug.

10. The image sensor of claim 9, further comprising:
a contact protection layer disposed on the insulating pattern,
wherein the capping insulating layer extends on an upper surface of the contact protection layer, while covering an upper surface of the color filter, and the conductive via passes through the capping insulating layer and the contact protection layer.

11. An image sensor, comprising:
an insulating pattern disposed on a semiconductor substrate and having an opening;
a through hole passing through the semiconductor substrate;
a through electrode disposed in the through hole;
a color filter disposed in the opening of the insulating pattern;
an antireflective layer disposed between the insulating pattern and the semiconductor substrate and between the color filter and the semiconductor substrate;
a capping insulating layer disposed on the color filter;
a contact plug passing through the insulating pattern and the antireflective layer and electrically connected to the through hole;
an electrode disposed on the capping insulating layer;
a separation structure surrounding a side surface of the electrode; and
a photoelectric layer disposed on the electrode and the separation structure,
wherein the separation structure has an upper surface recessed in a direction toward the semiconductor substrate, and
wherein the upper surface of the separation structure extends toward the semiconductor substrate from an upper surface of the electrode.

12. The image sensor of claim 11, wherein the separation structure includes a first insulating layer and a second insulating layer disposed on the first insulating layer, and the first insulating layer is formed of a material different from materials of the capping insulating layer and the second insulating layer.

13. The image sensor of claim 11, wherein the upper surface of the separation structure is a curved surface bent in the direction toward the semiconductor substrate.

14. An image sensor, comprising:
a semiconductor substrate having a first surface and a second surface opposing each other;
an insulating pattern disposed on the second surface of a semiconductor substrate and having a first opening;
a photodiode disposed in the semiconductor substrate;
a through hole passing through the semiconductor substrate;
a through electrode disposed in the through hole;
a color filter disposed in the first opening of the insulating pattern;
a contact plug passing through the insulating pattern;
a capping insulating layer disposed on the color filter;
a separation structure having a second opening overlapping the capping insulating layer and the contact plug;
a first electrode disposed in the second opening of the separation structure; and
a photoelectric layer disposed on the first electrode,
wherein the separation structure includes a first insulating layer and a second insulating layer formed of different materials and stacked sequentially, and
wherein an interface between the first insulating layer and the second insulating layer is disposed at a same distance from the second surface of the semiconductor substrate as at least a portion of the first electrode.

15. The image sensor of claim 14, further comprising:
a second electrode disposed on the photoelectric layer;
a cover insulating layer disposed on the second electrode; and
a microlens disposed on the cover insulating layer,
wherein the first electrode and the second electrode are transparent electrodes, and the photoelectric layer is an organic photoelectric layer contacting the first electrode and an upper surface of the separation structure.

16. The image sensor of claim 14, further comprising:
an isolation region disposed in a portion of the semiconductor substrate adjacent to the first surface of the semiconductor substrate; and
a circuit interconnection region disposed on the first surface of the semiconductor substrate,
wherein the through hole passes through the isolation region.

17. The image sensor of claim 12, wherein an interface between the first insulating layer and the second insulating layer is disposed at a same distance from a surface of the semiconductor substrate as at least a portion of the electrode, and
wherein a thickness of the second insulating layer is greater than a thickness of the first insulating layer.

18. The image sensor of claim 1, further comprising:
a photodiode disposed in the semiconductor substrate;
a through hole passing through the semiconductor substrate; and
a through electrode disposed in the through hole,
wherein the semiconductor substrate has a first surface and a second surface opposing each other, and the insulating pattern is disposed on the second surface of the semiconductor substrate.

19. The image sensor of claim 14, further comprising:
a through hole passing through the semiconductor substrate;
a through electrode disposed in the through hole;
an insulating spacer disposed between the through electrode and the semiconductor substrate;
an antireflective layer disposed between the insulating pattern and the second surface of the semiconductor substrate and between the color filter and the second surface of the semiconductor substrate; and
a contact plug passing through the insulating pattern and the antireflective layer and electrically connected to the through electrode.

* * * * *